US006631087B2

(12) United States Patent
Di Pede et al.

(10) Patent No.: US 6,631,087 B2
(45) Date of Patent: Oct. 7, 2003

(54) LOW VOLTAGE SINGLE POLY DEEP SUB-MICRON FLASH EEPROM

(75) Inventors: Luigi Di Pede, Toronto (CA); David Kinsey, Burlington (CA); James Kendall, Burlington (CA); Andrew Cervin-Lawry, Oakville (CA)

(73) Assignee: Gennum Corporation, Burlington (CA)

( * ) Notice: Subject to any disclaimer, the term of this patent is extended or adjusted under 35 U.S.C. 154(b) by 217 days.

(21) Appl. No.: 09/851,155

(22) Filed: May 9, 2001

(65) Prior Publication Data

US 2002/0005543 A1 Jan. 17, 2002

Related U.S. Application Data

(60) Provisional application No. 60/213,587, filed on Jun. 23, 2000.

(51) Int. Cl.[7] .............................................. G11C 16/04
(52) U.S. Cl. ........................... 365/185.18; 365/185.01; 365/185.05
(58) Field of Search ...................... 365/185.18, 185.05, 365/185.01

(56) References Cited

U.S. PATENT DOCUMENTS

| | | | | |
|---|---|---|---|---|
| 4,612,629 A | * | 9/1986 | Harari | 365/185.08 |
| 5,301,150 A | | 4/1994 | Sullivan et al. | 365/185 |
| 5,504,706 A | | 4/1996 | D'Arrigo et al. | 365/185.18 |
| 5,869,858 A | * | 2/1999 | Ozawa et al. | 257/296 |
| 5,986,931 A | | 11/1999 | Caywood | 365/185.06 |
| 6,030,869 A | * | 2/2000 | Odake et al. | 438/266 |
| 6,044,018 A | | 3/2000 | Sung et al. | 365/185.18 |
| 6,172,397 B1 | * | 1/2001 | Oonakado et al. | 257/321 |

OTHER PUBLICATIONS

New Observation and the Modeling of Gate and Drain Currents in Off–state P–MOSFET's, By Ming–Jer Chen, Kum–Chang Chao, Chris Chen, May 4, 1994, pp. 734–739.
Subbreakdown Drain Leakage Current in MOSFET, By J. Chen, T.Y. Chan, I.C. Chen, P.K. Ko and Chenming Hu, Nov. 11, 1987, pp. 515–517.
Flash Memory Cells—An Overview, By Paolo Pavan, Roberto Bez, Piero Olivo, Enrico Zanoni, Aug. 1997, pp. 1248–1271.

* cited by examiner

Primary Examiner—Vu A. Le
Assistant Examiner—Tuan T. Nguyen
(74) Attorney, Agent, or Firm—Bereskin & Parr; Isis E. Caulder

(57) ABSTRACT

An EEPROM memory cell comprising a transistor on a first conductivity type semiconductor substrate and a capacitor formed on a second conductivity type semiconductor substrate. The capacitor comprises first and second injector regions of third conductivity type, a channel region of second conductivity type separating the first and second injector regions and a first electrically floating structure disposed above the channel region, wherein a first edge portion of the floating structure overlaps a portion of the first injector region and a second edge portion of the first floating structure overlaps a portion of the second injector region, and a control gate region of fourth conductivity type located within the second conductivity type semiconductor substrate region. The gate structure and first floating structure are electrically connected together. In different aspects of the present invention, the EEPROM memory cell may also include a second capacitor.

63 Claims, 12 Drawing Sheets

LOW VOLTAGE SINGLE POLY DEEP SUB-MICRON FLASH EEPROM

This application claims the benefit of U.S. Provisional Application No. 60/213,587 filed Jun. 23, 2000.

FIELD OF THE INVENTION

This invention relates to semiconductor devices such as Electrically Erasable Programmable Read-Only Memory (EEPROM) devices. More particularly, it is concerned with Flash EEPROM devices comprising memory cells capable of operating at low voltages and being manufactured using conventional Complementary Metal-Oxide Semiconductor (CMOS) processes.

BACKGROUND OF THE INVENTION

Application Specific Integrated Circuits (ASIC) lie at the heart of most electrical systems and devices. An ASIC contains the specific functionality of the device or system on a single Integrated Circuit (IC) or Chip. Complementary Metal-Oxide Semiconductor (CMOS) process are used in the fabrication of ASICs and the manufacture of various discrete IC devices used in electrical systems and products. In many instances, when power is first applied to an electrical system or device, the existing ASICs and/or CMOS ICs within these devices or systems may require reconfiguration or programming. Microprocessor based systems are a good example of applications requiring programming and initialization when power is first applied to the device.

Electrically Erasable Programmable Read-Only Memory (EEPROM) devices provide a means for storing reconfiguration or programming information within an electrical system or device and are comprised of an array of memory cells. Each memory cell within the EEPROM device stores a single information bit in the form of electrical charge. EEPROM memory cells may be integrated within an ASIC device or used as a discrete EEPROM device that connects to several other ICs requiring programming or reconfiguration. The EEPROM must retain stored information or code even when the system has been tuned off. For this reason they are referred to as Non Volatile Memory (NVM). The EEPROM also provides the flexibility of being electrically erasable and re-programmable, allowing programming upgrades without the need for removing the EEPROM device from the system.

Many conventional CMOS processes only require a single layer of polysilicon during fabrication. However, memory devices such as EEPROMs mostly require multiple layers of polysilicon which require several additional steps during the fabrication process. These additional steps result in increased fabrication costs, lower yields and longer processing times. Memory architectures with single polysilicon layers and requiring no process changes or additions to a baseline deep sub-micron CMOS process greatly simplify the fabrication process of CMOS devices with integrated EEPROM cells.

Single polysilicon EEPROM devices have been developed which enable device fabrication using conventional CMOS processes. However, reliability issues during memory device programming, reading and erasing operations are of concern. Subsequent program, read or erase operations on a selected memory cell or cells may cause unselected memory cells with stored electrical charge to unwantingly discharge their stored electrical charge. Alternatively, unselected memory cells with no stored electrical charge may become electrically charged. As a result of these operations, disturbance mechanisms such as program disturb, gate program, and gate erase, may affect data integrity. Consequently, the architecture of the memory cell within a given single polysilicon EEPROM device must ensure reliability, by reducing these disturbance mechanisms during device program, read or erase operations.

Some single polysilicon EEPROM devices require relatively high voltages for reliable memory cell programming or erasing. High voltage program and erase signals introduce the need for memory cells with oxide insulation regions with increased thickness and external power supply bias voltages capable of supplying sufficient programming and erase currents. The increase in the oxide insulation region thickness consumes additional die area, while the use of external power supply bias voltages introduces additional external circuitry, complexity in and power consumption. Therefore, it is desirable to fabricate a charge-transfer voltage pump device within the EEPROM device (on chip), wherein the charge-transfer pump device generates the necessary program and erase voltages. However, there is a limit to the current that can be supplied to the EEPROM memory cells by the on chip charge-transfer voltage pump, and insufficient "programming" and "erase" current will decrease the program/erase window of the memory cells for storing charge or significantly increase the required program and erase times.

Accordingly, there is a need for single polysilicon EEPROM memory devices that operate at low erase and program voltages and currents. Furthermore, it is desirable that the memory cells do not suffer from various disturbances during the program, read and erase operations.

SUMMARY OF THE INVENTION

The present invention relates to single layer polysilicon memory devices, which may be fabricated using CMOS processes. In one aspect this invention relates to an EEPROM memory cell comprising a transistor device and capacitive device. The transistor device is formed on a first conductivity type semiconductor substrate wherein the transistor comprises an electrically floating gate structure, a source region within a graded diffusion region, and a drain region.

The capacitive device is formed on a second conductivity type semiconductor substrate and comprises a first and second injector region of third conductivity type, a channel region of second conductivity type separating the first and second injector regions, and a first electrically floating structure disposed above the channel region. A first edge portion of said floating structure overlaps a portion of the first injector region and a second edge portion of the first floating structure overlaps a portion of said second injector region. A control gate region of fourth conductivity type is located within the second conductivity type semiconductor substrate and the gate structure and said first floating structure are electrically connected together. The EEPROM memory cell comprising the transistor device and first capacitive device is capable of receiving bias voltages for electrically programming, electrically erasing and electrically reading the memory cell.

In another aspect of the present invention an EEPROM memory cell comprises a transistor device, a first capacitive device and second capacitive device. The transistor device is formed on a first conductivity type semiconductor substrate and comprises an electrically floating gate structure, a source region of second conductivity type either within or not within a graded diffusion region and a drain region of second conductivity type.

The first capacitive device is formed on a second semiconductor substrate of second conductivity type and comprises first and second injector regions of third conductivity type, wherein a first channel region of second conductivity type separates the first and second injector regions. A first electrically floating structure is disposed above the first channel region, wherein a first edge portion of the first floating structure overlaps a portion of the first injector region and a second edge portion of the first floating structure overlaps a portion of said second injector region. A first control gate region of fourth conductivity type is located within the second semiconductor substrate.

The second capacitive device is formed on a third semiconductor substrate region of second conductivity type, wherein the second capacitive device comprises a third and fourth injector regions of third conductivity type, a second channel region of the second conductivity type separating the third and fourth injector regions, and a second electrically floating structure disposed above the second channel region. A first edge portion of the second floating structure overlaps a portion of the third injector region and a second edge portion of the second structure overlaps a portion of the fourth injector region, and a second control gate region of fourth conductivity type is located within the third semiconductor substrate. The gate structure and the first and second structures are electrically connected together.

The EEPROM memory cell comprising the transistor device, first capacitive device and second capacitive device is capable of receiving bias voltages for electrically programming, electrically erasing and electrically reading the memory cell.

It will also be appreciated that in different aspects of the present invention, EEPROM memory cells comprising a transistor device, first capacitive device or first and second capacitive device may incorporate different structural variations.

DETAILED DESCRIPTION OF THE DRAWINGS

For a better understanding of the present invention and to show how it may be carried into effect, reference will now be made to the following drawings which show the preferred embodiment of the present invention, in which.

DETAILED DESCRIPTION OF THE PREFERRED EMBODIMENT

The present invention includes an electrically erasable and electrically programmable read only memory (EEPROM) cell capable of being fabricated using a single layer of polysilicon and a baseline deep sub-micron CMOS process and operating reliably at low program and erase voltages and currents. It is understood that references made to the type of semiconductor regions, device fabrication and device layout will be understood by someone skilled in the art.

Figure 1:
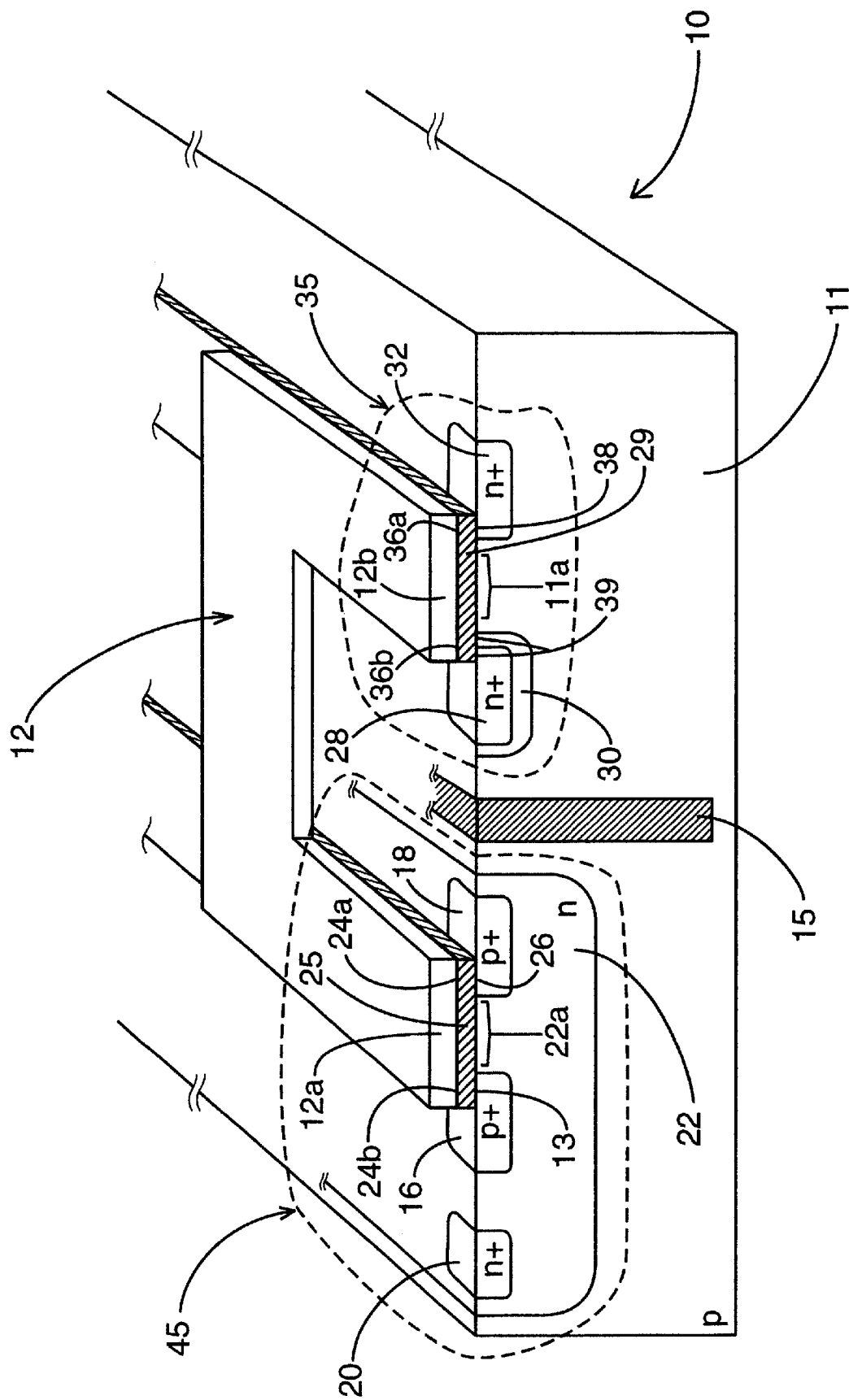
FIG. 1 shows a cross-section view of the memory cell comprising an NMOS transistor device and a capacitive device within an n-well substrate.

FIG. 1 shows the structure of a memory cell 10 comprising an NMOS transistor device 35 and capacitive device 45. The NMOS transistor 35 is formed on a p type substrate 11 and includes an n+ source region 28 within a deeper n− graded diffusion region 30, an n+ drain region 32 and a polysilicon floating gate structure 12b. Both the source and drain regions 28, 32 are separated by a p type channel region 11a, which is disposed below the floating gate structure 12b. A layer of gate oxide 29 in the range of 70 Angstroms thickness separates the floating gate 12b from the p type channel region 11a. A first edge portion 36b of the floating gate structure 12b overlaps an edge portion 39 of both the n+ source region 28 and n− graded diffusion region 30, whilst a second edge portion 36a of the floating gate structure 12b overlaps an edge portion 38 of the n+ drain region 32.

The capacitive device 45 is formed within an n-well region 22 which is formed within the p type substrate 11. The capacitive device includes a first p+ injector region 16, a second p+ injector region 18, an n+ control gate region 20 and a polysilicon floating structure 12a. Both the first and second p+ injector regions 16, 18 are separated by an n type channel region 22a, which is disposed below the floating structure 12a. A layer of gate oxide 25 in the range of 70 Angstroms thickness separates the floating structure 12a from the n type channel region 22a. A first edge portion 24b of the floating structure 12a overlaps an edge portion 13 of the p+ injector region 16, whilst a second edge portion 24a of the floating structure 12a overlaps an edge portion 26 of the second p+ injector region 18. Both the capacitive device 45 and transistor device 35 have a isolation region 15 located between them.

The memory cell 10 is programmed using the known in the art channel hot electron (CHE) method, whereby a bias voltage of approximately 5 V is applied to the drain region 32, the first p+ injector region 16, the second p+ injector region 18 and the n+ control gate region 20. Both P substrate 11 and source region 28 are held at ground potential. Under these bias voltage conditions, electrons flow in the p type channel region 11a between the drain 32 and source regions 28. The electric field between the source and drain regions 28, 32 provides the electrons with sufficient kinetic energy for some to surmount the silicon and oxide region potential barrier between the p type channel region 11a and oxide region 29. These electrons are attracted from the oxide region to the floating gate structure 12b under the influence of the bias voltage applied to the control gate region 20. The positive bias voltage (approximately 5 volts) applied to the control gate region 20 biases the n-well region, which is capacitively coupled from the n-well region 22 to the capacitor top plate 12a. The capacitor device 45 floating structure 12a and transistor device 35 floating gate structure 12b share a single continuous polysilicon layer 12 which is electrically floating. Consequently, voltage coupled to the capacitor device 45 floating structure 12a is also coupled to the floating gate structure 12b, wherein the bias voltage on the floating gate structure 12b attracts the electrons that have penetrated the transistor oxide layer 29. The electrons on the floating gate structure 12b provide the stored electrical charge necessary to program the memory cell 10.

The memory cell 10 is erased using the known in the art Fowler-Nordheim (FN) electron tunnelling method, whereby a bias voltage in the range of approximately −5 V is applied to the first and second p+ injector regions 16, 18. Also, a bias voltage of approximately 5 V is applied to the source region 28. Both the P substrate 11 and n+ control gate region 20 have ground potential applied to them, whilst the drain region 32 is electrically floating. Under these bias voltage conditions, the electrons stored on the floating gate structure 12b tunnel through the gate oxide region 29 to the positively biased source region 28, therefore, erasing the charge from the memory cell. Applying approximately −5 V to the p+ injector regions 16, 18 and grounding the n-well 22 via the control gate region 20 causes depletion layers to form under the floating structure 12a, wherein depletion layers form as a result of the reverse biased P+ injectors 16, 18 and n-well region 22. The depletion layers extend across the n-well channel region 22a, eliminating the capacitance between the electrically floating structure 12a and the n-well region 22. This causes increased voltage coupling to occur between the small capacitances provided between the overlapping portions 24a, 26, 24b, 13 of the p+ injectors 16, 18 and the floating structure 12a. Therefore, a relatively larger fraction of the approximately −5 V bias voltage is coupled to the floating structure 12a and consequently to the floating gate 12b. The negative bias voltage applied to the p+ injectors 16, 18 and the positive bias voltage (approximately 5 volts) applied to the source region 28 provide sufficient electric field strength (in the range of 8–10 MV/cm) for electrons on the floating gate 12b to tunnel through the oxide region 29 to the source 28. By removing the electric charge (electrons) from the floating gate 12b, the memory cell 10 is erased. By nesting the source region 28 within the n− graded diffusion region 30, erase speed and device reliability are increased.

The erase operation of the memory cell must ensure that a ground potential is applied to the control gate region 20 rather than receiving a negative bias voltage as with the p+ injectors 16, 18. In conventional CMOS devices and in accordance with this invention, the p substrate 11 is at grounded potential. A negative bias on the n-well 22 with respect to the p substrate 11 will cause the pn junction between these regions to be forward biased, causing current flow from the n-well 22 to the p substrate 11. Consequently, the control gate region 20 is grounded in order to avoid the mentioned forward biasing problem. Although this biasing mechanism eliminates the coupling capacitor between the electrically floating capacitor top plate 12a and the n-well region 22, the two P+ injectors 16, 18 provide enough capacitive coupling to couple sufficient negative bias voltage onto the floating gate for Fowler-Nordheim based erasing operations. The p+ injector regions 16, 18 enhance negative voltage coupling onto the floating gate 12b due to the channel depletion layers formed. This feature enables the memory cells to achieve Fowler-Nordheim based erasing operations with bias voltages of no more than ±5 V.

Memory cells are read in order to retrieve stored data without disturbing the stored electrical charge on them. A memory cell with stored electrical charge has a higher operating threshold than a memory cell without stored electrical charge. Consequently, by applying suitable bias voltages to the memory cell, the cell will turn 'on' or remain 'off' depending on the absence or presence of electrical charge. The memory cell 10 is read by applying a bias voltage in the range of 1–2 V to the first p+ injector region 16, the second p+ injector region 18 and the n+ control gate region 20. A bias voltage in the range of 1–2 V is applied to the drain region 32 and both the P substrate 11 and the source region 28 are grounded. If the floating gate 12b has no stored electrical charge, the applied bias voltages will turn the transistor device 35 'on' (above threshold) and electrons will flow in the p type channel region 11a between the drain 32 and source regions 28. Detection circuits will detect this current flow and convert it to a suitable logic level representing a data bit. Conversely, if the floating gate 12b has stored electrical charge, the applied bias voltages will not turn the transistor device 35 'on' (below threshold) and no electrons will flow in the p type channel region 11a between the drain 32 and source regions 28. The absence of detected current by the detection circuits will also be converted to a designated logic level that represents a data bit.

The reliability of EEPROM memory cells depends on their ability to maintain stored electrical charge under normal operating conditions (i.e. program, erase and read). For single polysilicon EEPROM cells, the electrical charge leakage through the oxide region under the transistor floating gate is the basic charge loss mechanism. There are many electrical charge loss mechanisms such as 'gate disturb', wherein electrical charge leaks through the oxide region, thus undesirably changing the value of stored data or information in unselected cells (not selected for program, read or erase operation).

In accordance with the present invention, the p+ injectors 16, 18 can be independently biased in order to avoid gate (program) disturb in unselected cells during the programming operation. The gate (program) disturb occurs when a programmed unselected memory cell is undesirably erased due to a positive bias voltage being applied to both its control gate and p+ injectors. In order to avoid gate program disturb, the p+ injector regions 16, 18 of unselected memory cells are grounded. By grounding the p+ injectors, 16, 18 the bias voltage of approximately 5 V on the control gate 20 of unselected memory cells does not undesirably erase them. This has been investigated experimentally by repeatedly programming a designated cell or cells and monitoring gate disturb by measuring the memory device voltage threshold variations.

Figure 2:
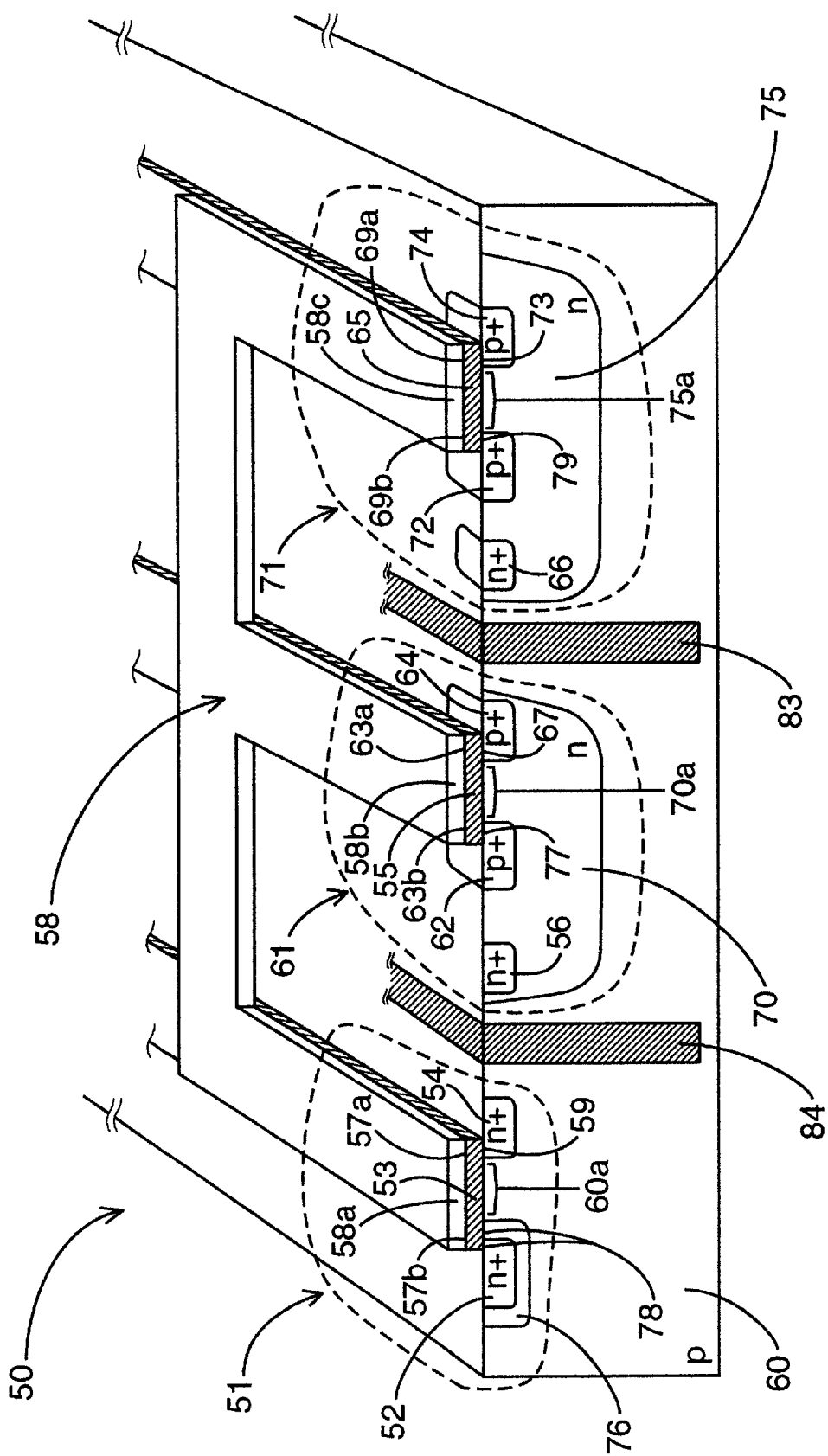
FIG. 2 shows a cross-section view of a memory device comprising a first and second capacitive device and an NMOS transistor device.

FIG. 2 illustrates an alternative embodiment of the present invention, wherein an additional capacitive 71 device is comprised within the memory cell 50, whereby memory cell programming is achieved by band-to-band tunneling (BTBT). Band-to-band tunnelling (BTBT) involves distorting (or bending) the energy band of a semiconductor structure in order to generate current flow as result the tunnelling of valence band carriers into the conduction band. In comparison with the channel hot electron injection (CHE) method used in programming the memory cell shown in FIG. 1, the band-to-band tunnelling (BTBT) method reduces the electrical current required for programming the memory cell. The reduced programming current enables the fabrication of low power on chip charge-transfer voltage pump circuits, EEPROM memory cells and application specific circuitry within a single conventional CMOS device. FIG. 2 shows the structure of a memory cell 50 comprising an NMOS transistor device 51, a first capacitive device 61 and a second capacitive device 71. The NMOS transistor 51 is formed on a p type substrate 60 and includes an n+ source region 52 within a deeper n− graded diffusion region 76, an n+ drain region 54 and a polysilicon floating gate structure 58a. Both the source 52 and drain region 54 are separated by a p type channel region 60a, which is disposed below the floating gate structure 58a. A layer of gate oxide 53 in the range of 70 Angstroms thickness separates the floating gate 58a from the p type channel region 60a. A first edge portion 57b of the floating gate structure 58a overlaps the edge portion 78 of the n+ source region 52 and n− graded diffusion region 76, whilst a second edge portion 57a of the floating gate structure 58a overlaps the edge portion 59 of n+ drain region.

The first capacitive device 61 is formed within a first n-well region 70 which is formed within the p type substrate 60. The capacitive device 61 includes a first p+ injector region 62, a second p+ injector region 64, a first n+ control gate region 56 and a polysilicon first floating structure 58b. Both the first and second p+ injector regions 62, 64 are separated by an n type channel region 70a, which is disposed below the capacitor first floating structure 58b. A first gate oxide layer 55 in the range of 70 Angstroms thickness separates the first floating structure 58b from the n type channel region 70a. A first edge portion 63b of the capacitor first floating structure 58b overlaps the edge portion 77 of the first p+ injector region 62 whilst a second edge portion 63a of the first floating structure 58b overlaps the edge portion 67 of the second p+ injector region 64.

The second capacitive device 71 is formed within a second n-well region 75 which is formed within the p type substrate 60. The capacitive device 71 includes a third p+ injector region 72, a fourth p+ injector region 74, a second n+ control gate region 66 and polysilicon capacitor second floating structure 58c. Both the third and fourth p+ injector regions 72, 74 are separated by an n type channel region 75a, which is disposed below the second floating structure 58c. A second gate oxide layer 65 in the range of 70 Angstroms thickness separates the second floating structure 58c from the n type channel region 75a. A first edge portion 69b of the capacitor second floating structure 58c overlaps the edge portion 79 of the third p+ injector region 72, whilst a second edge portion 69a of the second floating structure 58c overlaps the edge portion 73 of the fourth p+ injector region 74. The first capacitive device 61 first floating structure 58b, the second capacitive device 71 second floating structure 58c and the NMOS transistor 51 floating gate region 58a share a single continuous polysilicon layer 58 which is electrically floating. The first capacitive device 61, second capacitive device 71 and transistor device 51 have isolation regions 83, 84 between them.

The memory cell 50 is programmed using the band-to-band tunnelling (BTBT) method, wherein energetic electrons generated by BTBT tunnel through the oxide region 65 to the second floating structure 58c of the second capacitive device 71. Both the drain region 54 and source region 52 of the NMOS transistor device 51 are left floating or biased with a positive voltage. The p substrate 60 of the memory cell 50 is grounded. A bias voltage of approximately 5 V is applied to the first p+ injector region 62, the second p+ injector region 64 and the n+ control gate region 56 of the first capacitive device 61. This causes a large percentage of the approximately 5 V bias voltage to couple to the first floating structure 58b via the capacitive network formed between both the p+ injectors 62, 64, the first n-well region 70 and the first floating structure 58b. Most of the 5 V bias voltage is coupled to the first floating structure 58b due to the dominant capacitive coupling that occurs between the first n-well region 70 and the first floating structure 58b. By applying a bias voltage of approximately −5 V to the p+ injector regions 72, 74 and grounding the n-well 75 via the control gate region 66, depletion layers form under the second floating structure 58c, wherein the depletion layers form as a result of the reverse biased p+ injectors 72, 74 and n-well region 75. The depletion layers extend across the n-well channel region 75a, eliminating the capacitance between the electrically floating second floating structure 58c and the second n-well region 75. Consequently, this causes increased voltage coupling to the second floating structure 58c by means of the capacitances formed between the overlapping portions, indicated at 69a, 73 and 69b, 79. These capacitances are relatively small and cause most of the bias voltage (−5 V) applied to the p+ injectors 72, 74 to drop across the oxide region 65. Consequently, only a small percentage of the coupling voltage is coupled to the second floating structure 58c. A large percentage of the 5 V bias voltage coupled to the first floating structure 58b of the first capacitive device 61 also appears on the second floating structure 58c of the second capacitive device 71. The combination of the negative bias on the p+ injectors 72, 74 and the positive coupled voltage on the floating structure 58c results in energetic electron-hole pair generation in the reverse biased p+ injectors 72, 74 due to BTBT. The energetic electrons are attracted to the positively biased floating gate 58c and are injected through the gate oxide 65 and onto the floating gate 58c. The injected electrons are stored on the electrically floating polysilicon region 58 that comprises the first capacitive device 61 first floating structure 58b, the second capacitive device 71 second floating structure 58c and the NMOS transistor gate region 58a.

The memory cell 50 is erased using the Fowler-Nordheim method, wherein electrons tunnel from the NMOS transistor 51 gate region 58a through the transistor oxide region 53 to the source region 52. The memory cell 50 is erased by applying a bias voltage of approximately −5 V to the first and second p+ injector regions 62, 64 of the first capacitive device 61, and/or the third and fourth p+ injector regions 72, 74 of the second capacitive device 71. Also, a bias voltage of approximately 5 V is applied to the source region 52 of the transistor device 51. The P substrate 60, n+ control gate region 56 of the first capacitive device 61 and the second n+ control gate region 66 of the second capacitive device 71 are grounded. Alternatively, the p+ injectors 72, 74 and n+ control gate region 66 of the second capacitive device 71 can be left electrically floating. The drain region 54 is also electrically floating during the erase operation of the memory cell 50. Under these bias voltage conditions, the electrons stored on the floating gate structure 58a tunnel through the gate oxide region 53 to the positively biased source region 52, therefore, erasing the charge from the memory cell. The erase operation of this memory device 50 is similar to the memory device 10 illustrated in FIG. 1. By applying approximately −5 V to the p+ injector regions 62, 64, 72, 74 and grounding the n-well regions 70, 75, depletion layers are formed under the floating structures 58b, 58c, wherein depletion layers form as a result of the reverse biased P+ injector regions 62, 64, 72, 74 and grounded n-well regions 70, 75. The depletion layers extend across the n-well channel regions 70a, 75a, eliminating the capacitances between the electrically floating structures 58b, 58c and the n-well regions 70, 75. This causes increased voltage coupling to occur between the small capacitances created between portions 77, 67, 79, 73 of P+ injectors 62, 64, 72, 74 which overlap with portions 63b, 63a, 69a, 69b of the first and second floating structures 58b and 58c. However, the small fraction of negative bias voltage (approximately −5 V) coupled to the floating gate 58a and the positive bias applied to the source (approximately 5 V) provide sufficient electric field strength for Fowler Nordheim electron tunnelling (in the range of 8–10 MV/cm) across the transistor oxide region 53 between the floating gate 58a and source region 52. This causes electrons to tunnel through the oxide region 53 from the floating gate 58a to the source region 52. By removing the electric charge (electrons) from the floating gate 58a, the memory cell 50 is erased.

The read operation of this memory device 50 is identical to that of memory cell 10, wherein a bias voltage in the range of 1–2 V is applied to the first p+ injector region 62, the second p+ injector region 64 and the n+ control gate region 56 of the first capacitive device 61. Also, a 1–2 V bias voltage is applied to the third p+ injector region 72, the fourth p+ injector region 74 and the n+ control gate region 66 of the second capacitive device 71. A bias voltage in the range of 1–2 V is applied to the drain region 54 and both the P substrate 60 and the source region 52 are held at ground potential. If the floating gate 58a has no stored electrical charge, the applied bias voltages will turn the transistor device 51 'on' (above threshold) and electrons will flow in the p type channel region 60a between the drain 54 and source regions 52. Detection circuits will detect this current flow and convert it to a suitable logic level representing a data bit. Conversely, if the floating gate 58a has stored electrical charge, the applied bias voltages will not turn the transistor device 51 'on' (below threshold) and no electrons will flow in the p type channel region 60a between the drain 54 and source regions 52. The absence of detected current by the detection circuits will also be converted to a designated logic level that represents a data bit.

In accordance with the present invention, the p+ injectors 62, 64 can be independently biased in order to avoid gate (program) disturb in unselected cells during the programming operation. The gate (program) disturb occurs when a programmed unselected memory cell is erased due to a positive bias voltage being applied to both its control gate 56 and p+ injectors 62, 64. In order to avoid gate program disturb, the p+ injector regions 62, 64 of unselected memory cells are grounded. By grounding the p+ injectors, the bias voltage of approximately 5 V on the control gate of unselected memory cells does not undesirably erase them.

Figure 3:
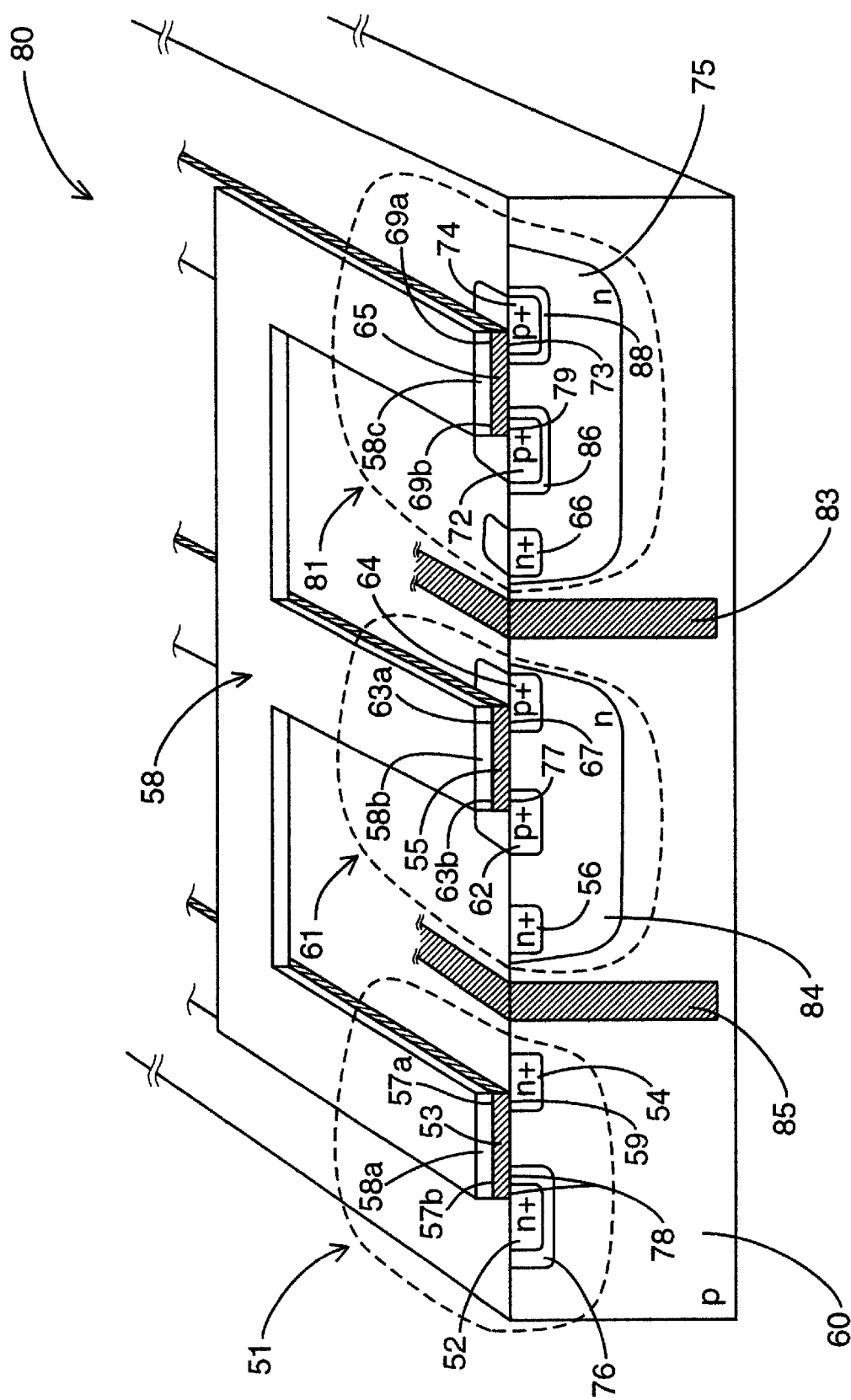
FIG. 3 shows a cross-section view of a memory device comprising a first capacitive device, a second capacitive device with n− graded diffusion regions and an NMOS transistor device.

FIG. 3 shows yet another embodiment of the present invention. The applied voltage bias conditions associated with programming, erasing and reading memory cell 80, are identical to the memory cell previously described and illustrated in FIG. 2. Memory cell 80 differs from memory cell structure 50 only in that its second capacitive device 81 p+ injector regions 72, 74 are within n− graded diffusion regions 86, 88. This enables the memory cell 80 to be programmed by BTBT and/or Zener Hot Electron injection. By nesting the p+ injectors 72, 74 within the n− graded diffusion regions 86, 88, programming speed is increased. Furthermore, the n− graded diffusion region 76 within the transistor device 51 improves erase speed and reliability in these circuits.

Figure 4:
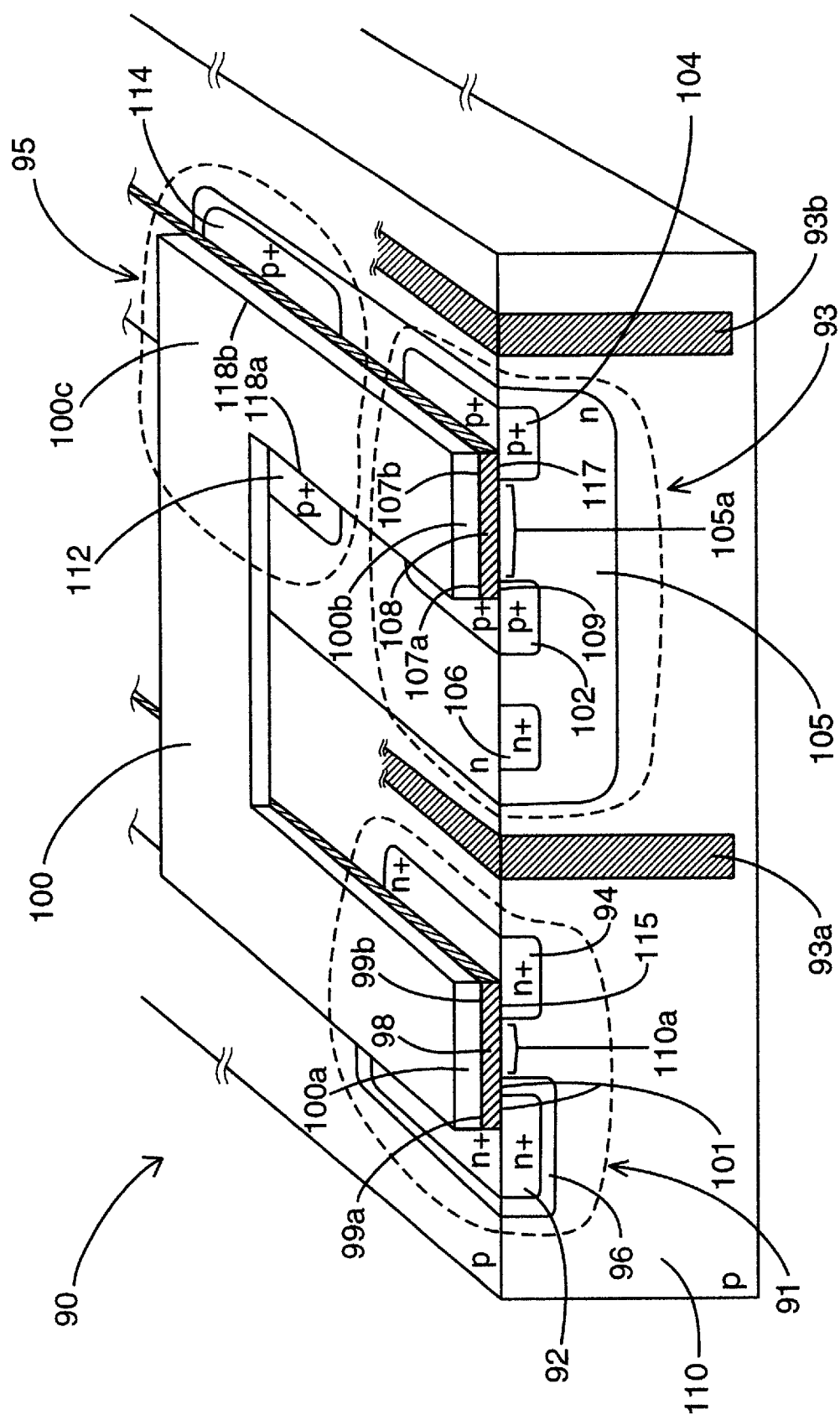
FIG. 4 shows a cross-section view of a memory device comprising an NMOS transistor device and a first and second capacitive device within a common n well region.

FIG. 4 illustrates an alternative aspect of the present invention, wherein a memory cell 90 comprises a first capacitive device 93 and a second capacitive device 95 that share the same n-well region 105, and an NMOS transistor device 91. The biasing conditions for program, erase and read operations of the memory cell 90 is identical to that of the previously described memory cells 50, 80 illustrated in FIG. 2 and FIG. 3 respectively. The advantage of this embodiment is that the memory cell 90 has a reduced size relative to memory cells 50 and 80. This is due to fabricating the first and second capacitive devices 93, 95 within the same n-well region 105.

The NMOS transistor 91 is formed on a p type substrate 110 and includes an n+ source region 92 within a n− graded diffusion region 96, an n+ drain region 94 and a polysilicon floating gate structure 100a. Both the source and drain regions 92, 94 are separated by a p type channel region 110a, which is disposed below the floating gate structure 100a. A layer of gate oxide 98 in the range of 70 Angstroms thickness separates the floating gate 100a from the p type channel region 110a. A first edge portion 99a of the floating gate structure 100a overlaps the edge portion 101 of the n+ source region 92 and n− graded diffusion region 96, whilst a second edge portion 99b of the floating gate structure 100a overlaps the edge portion 115 of the n+ drain region 94.

The first capacitive device 93 is formed within an n-well region 105 which is formed within the p type substrate 110. The capacitive device 93 includes a first p+ injector region 102, a second p+ injector region 104, an n+ control gate region 106 and a polysilicon first floating structure 100b. Both the first and second p+ injector regions 102, 104 are separated by an n type channel region 105a, which is disposed below the capacitor first floating structure 100b. A first gate oxide layer 108 in the range of 70 Angstroms thickness separates the capacitor device 93 first floating structure 100b from the n type channel region 105a. A first edge portion 107a of the capacitor first floating structure 100b overlaps the edge portion 109 of the first p+ injector region 102, whilst the second edge portion 107b of the first floating structure 100b overlaps the edge portion 117 of the second p+ injector region 104.

The second capacitive device 95 is formed within the same n-well region 105 as the first capacitive device 93, wherein the second capacitive device 95 is longitudinally adjacent to the first capacitive device 93. The second capacitive device 95 includes a third p+ injector region 112, a fourth p+ injector region 114 and polysilicon second floating structure 100c. The n+ control gate region 106 is common to both capacitive devices 93, 95 and provides voltage biasing to the common n-well region 105. Both the third and fourth p+ injector regions 112, 114 are separated by an n type channel region, (not shown) which is disposed below the capacitor device 95 second floating structure 100c. A second gate oxide layer (not shown) in the range of 70 Angstroms thickness separates the second floating structure 100c from the n type channel region. A first edge portion 118a of the second floating structure 100c overlaps the edge portion (not shown) of the third p+ injector region 112, whilst the second edge portion 118b of the second floating structure 100c overlaps the edge portion (not shown) of the fourth p+ injector region 114. The first capacitive device 93 first floating structure 100b, the second capacitive device 95 second floating structure 100c and the NMOS transistor 91 floating gate region 100a share a single continuous polysilicon layer 100 which is electrically floating. The first capacitive device and second capacitive devices 93, 95 and the transistor device 91 have an isolation region 93a between them.

The programming, erase and read operations of the memory cell 90 are identical to the previously described memory cells 50, 80 illustrated in FIG. 2 and FIG. 3. The memory cell 90 programming is achieved by BTBT through the second capacitive device 95 oxide region (not shown) to the second floating structure 100c. The erase operation is achieved by Fowler-Nordheim electron tunnelling (stored charge) through the transistor 91 oxide region 98 to the source region 92. The read operation is carried out by sensing the presence or absence of charge flow in the NMOS transistor 91 as previously discussed.

Memory device 90 programming is achieved by applying a bias voltage of approximately 5 V to the first and second p+ injectors 102, 104 of the first capacitive device 93 and the control gate region 106 of the n-well 105. A voltage of approximately −5 V is applied to the third and fourth p+ injectors 112, 114 of the second capacitive device 95, whilst the drain and source region 92, 94 of the transistor 91 are electrically floating or positively biased.

The read operation for this memory device 90 is achieved by applying a 1–2 V bias voltage to the first p+ injector region 102, the second p+ injector region 104 and the n+ control gate region 106 of the first capacitive device 93 and/or a 1–2 V bias voltage is applied to the third p+ injector region 112 and fourth p+ injector region 114 of the second capacitive device 95. A bias voltage in the range of 1–2 V is applied to the drain region 94 and both the P substrate 110 and the source region 92 are held at ground potential. The read operation follows the same operation procedure as previously described and known in the art.

Memory device erasing 90 is achieved by applying a bias voltage of approximately −5 V to the first and second p+ injectors 102, 104 of the first capacitive device 93 and/or the third and fourth p+ injectors 112, 114 of the second capacitive device 95. Alternatively, the p+ injectors 112, 114 of the second capacitive device 95 can be left electrically floating. A bias voltage of approximately 5 V is applied to the source region 92, whilst the n+ control gate region 106 is grounded in order to ground the n-well region 105. Also, the drain region 94 is electrically floating.

Although this embodiment reduces the memory cell size in comparison to those described in FIG. 2 and FIG. 3, reverse bias breakdown may occur between the common n-well region 105 and the second capacitive device 95 p+ injectors 112, 114 if programming bias voltages are not reduced. During the programming operation a bias voltage of approximately 5 V is applied to the p+ injectors 102, 104 of the first capacitive device 93, and the n-well region 105 is biased by applying approximately 5 V to the control gate region 106. The second capacitive device p+ injectors 112, 114 are negatively biased at approximately −5 V to achieve BTBT programming. Under these bias condition, the total voltage across the p+ injectors 112, 114 of the second capacitive device 95 and the n-well region 105 exceeds 10 V, which is approaching the reverse bias breakdown voltage for this junction. Consequently, the bias voltages must be reduced at the expense of memory cell 90 programming (BTBT tunnelling and voltage coupling) efficiency.

In accordance with the present invention, the p+ injectors 102, 104 can be independently biased in order to avoid gate (program) disturb in unselected cells during the programming operation. The gate (program) disturb occurs when a programmed unselected memory cell is erased due to a positive bias voltage being applied to both its control gate 106 and p+ injectors 102, 104. In order to avoid gate program disturb, the p+ injector regions 102, 104 of unselected memory cells are grounded. By grounding the p+ injectors, the bias voltage of approximately 5 V on the control gate of unselected memory cells does not undesirably erase them.

Figure 5:
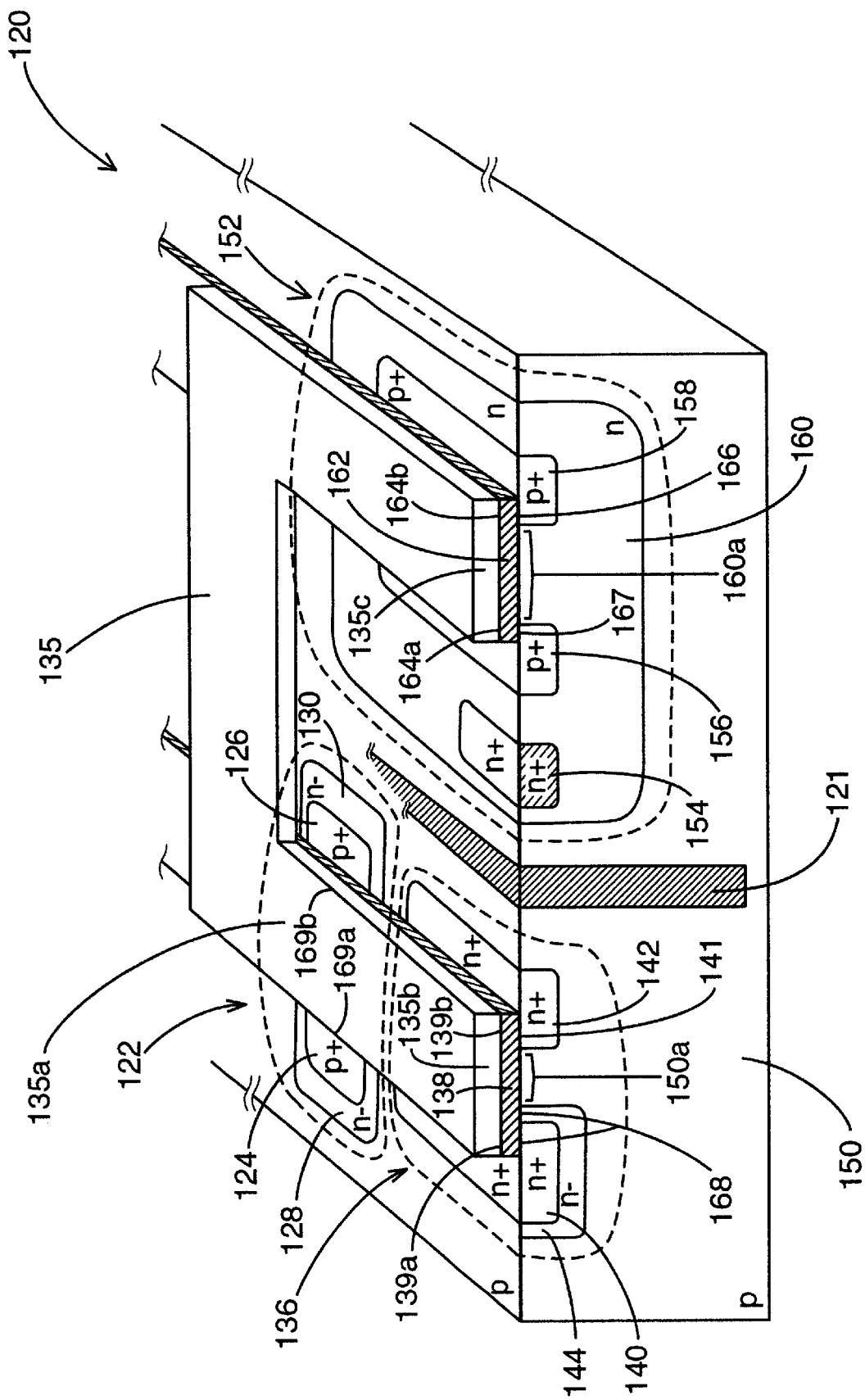
FIG. 5 shows a cross-section view of a memory device comprising an NMOS transistor, a first capacitive device and a second capacitive device fabricated within the p substrate region.

The memory cell structure 120 shown in FIG. 5 addresses the operating constraints associated with the previous memory cell structure 90, by incorporating a second capacitive device 122 within the p type substrate region 150 comprising an NMOS transistor 136. In this embodiment of the present invention, the memory cell 120 maintains a reduced cell size without subjecting the device to operating voltages beyond the junction breakdown voltages. The NMOS transistor 136 is formed on a p type substrate 150 and includes an n+ source region 140 within a deeper n− graded diffusion region 144, an n+ drain region 142 and a polysilicon floating gate structure 135b. Both the source and drain regions are separated by a p type channel region 150a, which is disposed below the floating gate structure 135b. A layer of gate oxide 138 in the range of 70 Angstroms thickness separates the floating gate 135b from the p type channel region 150a. A first edge portion 139a of the floating gate structure 135b overlaps the edge portion 168 of the n+ source region 140 and n− graded diffusion region 144, whilst a second edge portion 139b of the floating gate structure 135b overlaps the edge portion 141 of the n+ drain region 142.

The first capacitive device 152 is formed within an n-well region 160 which is formed within the p type substrate 150. The capacitive device 152 includes a first p+ injector region 156, a second p+ injector region 158, n+ control gate region 154 and a polysilicon first floating structure 135c. Both the first and second p+ injector regions 156, 158 are separated by an n type channel region 160a, which is disposed below the capacitor first floating structure 135c. A first gate oxide layer 162 in the range of 70 Angstroms thickness separates the first floating structure 135c from the n type channel region 160a. A first edge portion 164a of the first floating structure 135c overlaps the edge portion 167 of the first p+ injector region 156, whilst the second edge portion 164b of the first floating structure 135c overlaps the edge portion 166 of the second p+ injector region 158.

The second capacitive device 122 is formed within the region comprising the transistor device 136, wherein the second capacitive device 122 is adjacent to the transistor device 136. The second capacitive device 122 includes a third p+ injector region 124 within an n− graded diffusion region 128, a fourth p+ injector region 126 within an n− graded diffusion region 130 and polysilicon second floating structure 135a. Both the third and fourth p+ injector regions 124, 126 are separated by a p type channel region, (not shown) which is disposed below the second floating structure 135a. A second gate oxide layer (not shown) in the range of 70 Angstroms thickness separates the second floating structure 135a from the p type channel region. A first edge portion 169a of the second floating structure 135a overlaps the edge portion (not shown) of the third p+ injector region 124 whilst the second edge portion 169b of the second floating structure 135a overlaps the edge portion (not shown) of the fourth p+ injector region 126. The first capacitive device 152 floating structure 135c, the second capacitive device 122 second floating structure 135a and the NMOS transistor 136 floating gate region 135b share a single continuous polysilicon layer 135 which is electrically floating. An isolation region 121 is provided between the first capacitive device 152, and the second capacitive device 122 and transistor device 136.

The programming, erase and read operations of the memory cell 120 are identical to the previously described memory cells 50, 80 illustrated in FIG. 2 and FIG. 3. The memory cell programming 120 is achieved by BTBT and/or Zener Hot Electron injection through the second capacitive device 122 oxide region (not shown) to the second floating structure 135a. The n– graded diffusion region in the transistor device 136 improves memory device 120 erase speed and reliability. The erase operation is achieved by Fowler-Nordheim tunnelling, whereby electrons tunnel (stored charge) through the transistor 136 oxide region 138 to the source region 140. The read operation is carried out by sensing the presence or absence of charge flow in the NMOS transistor 136 as previously discussed.

The bias voltages for memory device 120 programming are provided by applying approximately 5 V to the first and second p+ injectors 156, 158 of the first capacitive device 152 and the control gate region 154 of the n-well 160. A voltage of approximately –5 V is applied to the third and fourth p+ injectors 124, 126 of the second capacitive device 122, whilst the drain region 142 and source region 140 of the transistor 136 are electrically floating or positively biased. The n– graded diffusion regions 128, 130 of the second capacitive device 122 are positively biased or grounded, wherein the n– graded diffusion regions isolate the p+ injectors 124, 126 from the p substrate 150.

The bias voltages for memory device 120 erasing are provided by applying a bias voltage of approximately –5 V to the first and second p+ injectors 156, 158 of the first capacitive device 152 and/or the third and fourth p+ injectors 124, 126 of the second capacitive device 122. Alternatively, the p+ injectors 124, 126 of the second capacitive device 122 can be left electrically floating. A bias voltage of approximately 5 V is applied to the source region 140, whilst the n+ control gate region 154 is grounded in order to ground the n-well region 160. Also, drain region 142 and both n– graded diffusion regions 128, 130 of the second capacitive device 122 are electrically floating or grounded.

The read operation follows the same operation procedure as previously described and known in the art. The read operation for this memory device 120 is achieved by applying a bias voltage in the range of 12 V to the first p+ injector region 156, the second p+ injector region 158 and the n+ control gate region 154 of the first capacitive device 152 and/or a 1–2 V bias voltage is applied to the third p+ injector region 124 and fourth p+ injector region 126 of the second capacitive device 122. A bias voltage in the range of 1–2 V is applied to the drain region 142 and both the P substrate 150 and the source region 140 are held at ground potential. Both n– graded diffusion regions 128, 130 of the second capacitive device 122 are electrically floating.

In accordance with the present invention, the p+ injectors 156, 158 can be independently biased in order to avoid gate (program) disturb in unselected cells during the programming operation. The gate (program) disturb occurs when a programmed unselected memory cell is erased due to a positive bias voltage being applied to both its control gate 154 and p+ injectors 156, 158. In order to avoid gate program disturb, the p+ injector regions 156, 158 of unselected memory cells are grounded. By grounding the p+ injectors, the bias voltage of 5–6 V on the control gate of unselected memory cells does not undesirably erase them.

Figure 6:
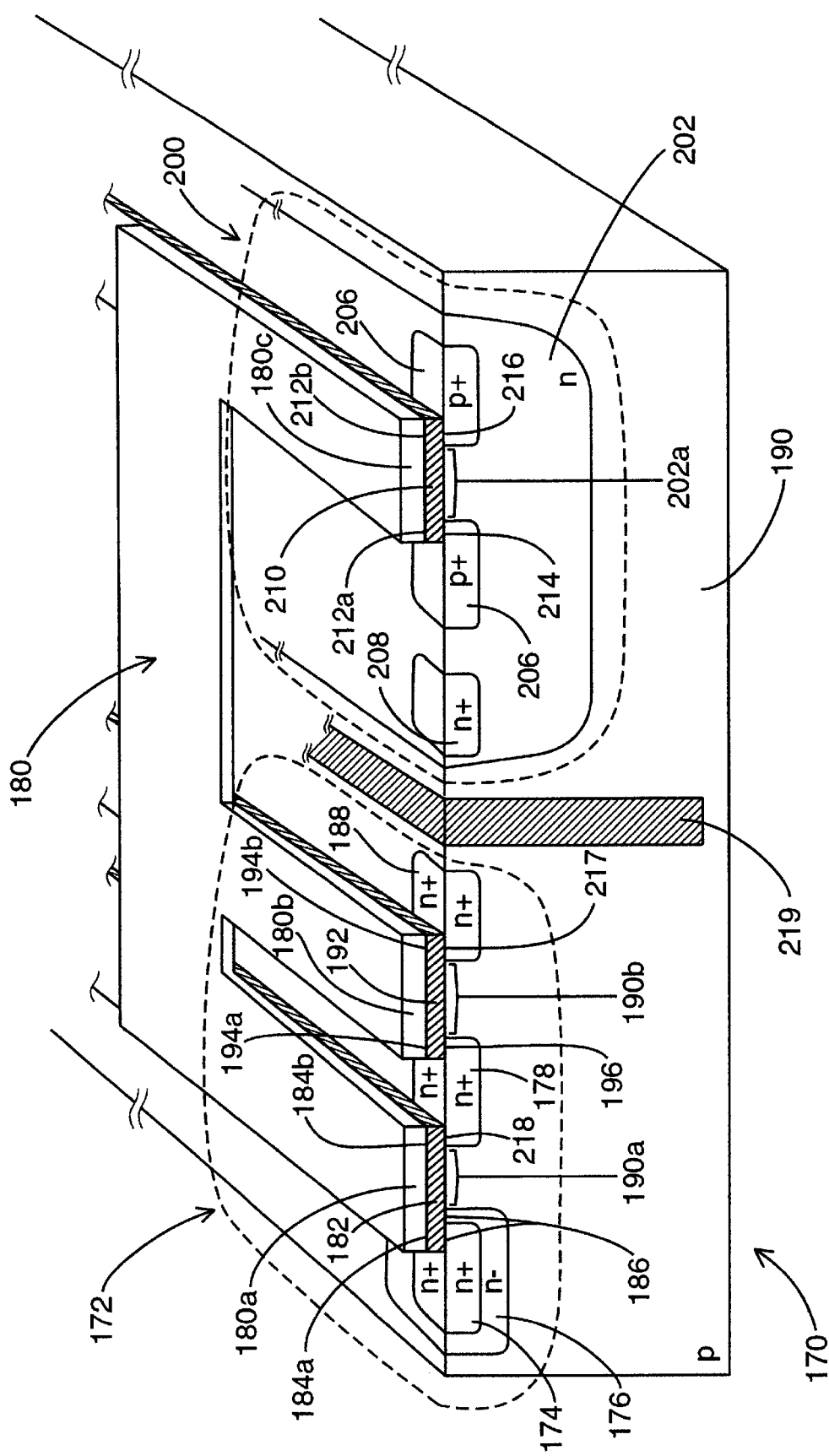
FIG. 6 shows a cross-section view of a memory device comprising two NMOS transistors sharing a common drain region, and a capacitive device.

FIG. 6 shows yet another alternative embodiment of the present invention, wherein a memory cell 170 comprises a capacitive device 200 and a two NMOS transistor device 172 with split floating gate 180a, 180b. The NMOS transistor device 172 is formed on a p type substrate 190 and includes a first n+ source region 174 within an n– graded diffusion region 176, a common n+ drain region 178, a second source region 188 and a split polysilicon floating gate structure comprising a first floating gate element 180a and a second floating gate element 180b. The first source region 174 and common drain region 178 are separated by a first p type channel region 190a, which is disposed below the first floating gate 180a. A layer of first gate oxide 182 in the range of 70 Angstroms thickness separates the first floating gate 180a from the first p type channel region 190a. A first edge portion 184a of the first floating gate element 180a overlaps the edge portion 186 of the first n+ source region 174 and n– graded diffusion region 176, whilst the second edge portion 184b of the first floating gate element 180a overlaps the first portion 218 of the common n+ drain region 178. The second source region 188 and common drain region 178 are separated by a second p type channel region 190b, which is disposed below the second floating gate element 180b. A layer of second gate oxide 192 in the range of 70 Angstroms thickness separates the floating gate 180b from the second p type channel region 190b. A first edge portion 194a of the second floating gate element 180b overlaps the second edge portion 196 of the common n+ drain region 178, whilst a second edge portion 194b of the second floating gate element 180b overlaps the edge portion 217 of the second n+ source region 188.

The capacitive device 200 is formed within an n-well region 202 which is formed within the p type substrate 190. The capacitive device 200 includes a first p+ injector region 204, a second p+ injector region 206, n+ control gate region 208 and a polysilicon floating structure 180c. Both the first and second p+ injector regions 204, 206 are separated by an n type channel region 202a, which is disposed below the floating structure 180c. A gate oxide layer 210 in the range of 70 Angstroms thickness separates the floating structure 180c from the n type channel region 202a. A first edge portion 212a of the floating structure 180c overlaps the edge portion 214 of the first p+ injector region 204, whilst a second edge portion 212b of the floating structure 180c overlaps the edge portion 216 of the second p+ injector region 206. Both floating gate elements 180a, 180b and the floating structure 180c are electrically connected and form a single polysilicon layer 180 which is electrically floating. An isolation region 219 is provided between the capacitive device 200 and transistor device 172.

Memory device 170 programming is achieved by applying a positive bias voltage of approximately 5 V to the first p+ injector 204, the second p+ injector 206 and the n-well 202 control gate region 208 of the capacitive device 200. A positive bias voltage of approximately 5 V is also applied to the common n+ drain region 178 whilst the second source region 188 of the transistor device 172 is grounded. Also, the first source region 174 of the transistor device 172 is electrically floating. According to this aspect of the present invention, programming is achieved by the Channel Hot Electron (CHE) method, wherein the transistor device 172 structure provides increased CHE programming efficiency (higher programmed device threshold voltage). The electric field applied between the common drain 178 and second source region 188 provide hotter electrons (higher energy) during the CHE programming process. This is due to the absence of an n– graded diffusion region at this source region 188.

The read operation for this memory device 170 is achieved by applying a positive bias voltage in the range of 1–2 V to the first p+ injector region 204, the second p+ injector region 206 and the n+ control gate region 208 of the capacitive device 200. A bias voltage in the range of 1–2 V is applied to the common n+ drain region 178 and both the p substrate 190 and the second source region 188 are held at ground potential. The first source region 174 is electrically floating. Alternatively, the second source region 188 may be electrically floating, whilst the first source region 174 is grounded. As previously discussed and known in the art, the read operation determines the absence (unprogrammed) or presence (programmed) of electrical charge in the memory cell.

The memory device 170 erasing is achieved by applying a negative bias voltage of approximately −5 V to the first p+ injector 204, the second p+ injector 206, whilst the n-well 202 control gate region 208 of the capacitive device 200 are grounded. A positive bias voltage of approximately 5 V is applied to the first source region 174 with an n− graded diffusion region 176, whilst the second source region 188 and common drain region 178 are electrically floating. Also, the p substrate is grounded. The erasing operation is achieved by Fowler-Nordheim (FN) electron tunnelling through the oxide region 182 between the first floating gate element 180a and the first source region 174. In accordance with the present invention, a fraction of the negative bias voltage (e.g. −5 V) applied to the p+ injectors 204, 206 couples to the electrically floating structure 180c and consequently to the floating gate structure 180a of the transistor 172. Therefore, sufficient voltage occurs across the first gate oxide 182 of the transistor device 172, which provides sufficient electric field strength (in the range of 8–10 MV/cm) for FN electron tunnelling. The first source region 174 is nested within an n− graded diffusion region, wherein the n− graded diffusion region improves the erase reliability and erase speed. The transistor device 172 utilises the source region 174 within the n− graded diffusion region 176 for improving the FN erasing speed of the memory cell 170, whilst the second source region 188 with no n− graded diffusion region optimises the CHE programming of the memory cell 170.

In accordance with the present invention, the p+ injectors 204, 206 can be independently biased in order to avoid gate (program) disturb in unselected cells during the programming operation. The gate (program) disturb occurs when a programmed unselected memory cell is undesirably erased due to a positive bias voltage being applied to both its control gate 208 and p+ injectors 204, 206. In order to avoid gate program disturb, the p+ injector regions 204, 206 of unselected memory cells are grounded. By grounding the p+ injectors, the bias voltage of approximately 5 volts on the control gate of unselected memory cells does not undesirably erase them.

Figure 7:
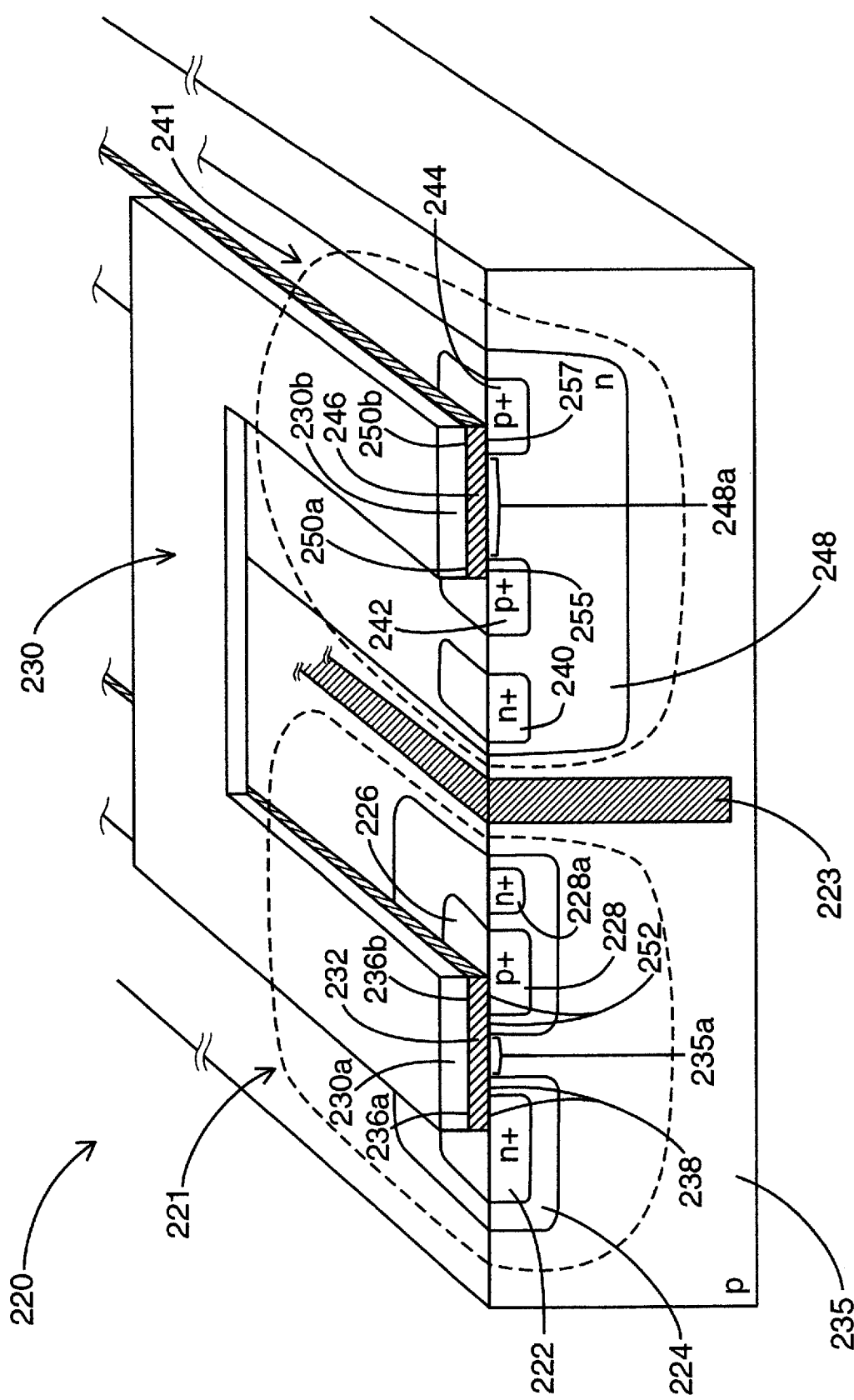
FIG. 7 shows a cross-section view of a memory device comprising a capacitive device and a transistor device with an n type source region and a p type region embedded in an n-type drain region.

FIG. 7 shows an alternative embodiment of the present invention, wherein a memory cell 220 comprises a transistor device 221 and a capacitive device 241. The transistor device is formed on a p substrate 235 and includes a n+ source region 222 within an n− graded diffusion region 224, a p+ drain region 226 within an n− graded diffusion region 228 comprising an n+ contact region 228a and a polysilicon floating gate structure 230a. The source region 222 and drain region 226 are separated by a p type channel region 235a, which is disposed below the floating gate 230a. A layer of gate oxide 232 in the range of 70 Angstroms thickness separates the floating gate 230a from the p type channel region 235a. A first edge portion 236a of the floating gate element 230a overlaps the edge portion 238 of the n+ source region 222 and n− graded diffusion region 224, whilst a second edge portion 236b of the floating gate element 230a overlaps the edge portion 252 of the p+ drain region 226 and n− graded diffusion region 228.

The capacitive device 241 is formed within an n-well region 248 which is formed within the p type substrate 235. The capacitive device 241 includes a first p+ injector region 242, a second p+ injector region 244, an n+ control gate region 240 and a polysilicon floating plate 230b. Both the first and second p+ injector regions 242, 244 are separated by an n type channel region 248a, which is disposed below the capacitor floating plate structure 230b. A gate oxide layer 246 in the range of 70 Angstroms thickness separates the floating structure 230b from the n type channel region 248a. A first edge portion 250a of the floating structure 230b overlaps the edge portion 255 of the first p+ injector region 242, whilst a second edge portion 250b of the floating structure 230b overlaps the edge portion 257 of the second p+ injector region 244. The transistor device 221 floating gate 230a and the capacitive device 241 floating structure 230b are electrically connected and form a single polysilicon layer 230 which is electrically floating. An isolation region 223 is provided between the capacitive device 241 and the transistor device 221.

The memory device 220 is programmed by applying a bias voltage of approximately 5 V to the first and second p+ injectors 242, 244 and the control gate region 240 of the capacitive device 241. A negative bias voltage of approximately −5 V is applied to the p+ drain region 226 and the n− graded diffusion region 228 surrounding the p+ drain region 226 is either grounded or positively biased. Both the p substrate 235 and the transistor 221 source region 222 are grounded. By applying a negative bias voltage to the p+ injector region 226, electrons are generated and injected through the oxide region 232 to the floating gate 230a as a result of BTBT. Also, zener programming may occur due to the reverse bias voltage across the p+ drain region 226 and n− diffusion region 228. The electric field for BTBT programming is provided by the voltage coupled from the capacitive device 241 onto the floating gate 230a and the approximately −5 V bias voltage applied to the p+ drain region 226. This embodiment of the present invention provides BTBT programming and FN erasing through a single transistor device 221 and capacitive device 241 which offers both the low power consumption advantage of BTBT and Fowler-Nordheim electron tunnelling and the reduced memory cell 220 size advantage.

Memory cell 220 erasing is achieved using the previously described and known in the art method of Fowler-Nordheim (FN) electron tunnelling, whereby electrons tunnel through the gate oxide 232 from the floating gate structure 230a to the source region 222. The memory cell 220 is erased by applying a bias voltage of approximately −5 V to the first and second p+ injectors 242, 244, whilst the n+ control gate region 240 is grounded in order to ground the n-well region 248. A bias voltage of approximately 5 V is applied to the source region 222 and the drain region 226 and n− graded diffusion region 228 are electrically floating. By coupling negative bias voltage from the p+ injectors 242, 244 onto the capacitor floating plate 230b and therefore the transistor 221 floating gate 230a, sufficient electric field for FN erasing is generated across the gate oxide 232 between the floating gate 230a and the positively biased source region 222. Therefore, electrons tunnel through the gate oxide 232 from the floating gate 230a to the source region 222.

The read operation for this memory device 220 is achieved by applying a positive bias voltage in the range of 1–2 V to the first p+ injector region 242, the second p+ injector region 244 and the n+ control gate region 240 of the capacitive device 241. A bias voltage in the range of 1–2 V is applied to the n+ contact region 228a of the n− graded diffusion region 228, the p+ drain region 226 is electrically floating and both the p substrate 235 and the source region 222 are held at ground potential. As previously discussed and known in the art, the read operation determines the absence (unprogrammed) or presence (programmed) of electrical charge in the memory cell.

In accordance with the present invention, the p+ injectors 242, 244 can be independently biased in order to avoid gate (program) disturb in unselected cells during the programming operation. The gate (program) disturb occurs when a programmed unselected memory cell is erased due to a positive bias voltage being applied to both its control gate 240 and p+ injectors 242, 244. In order to avoid gate program disturb, the p+ injector regions 242, 244 of unselected memory cells are grounded. By grounding the p+ injectors, the bias voltage of approximately 5 V on the control gate of unselected memory cells does not undesirably erase them.

Figure 8:
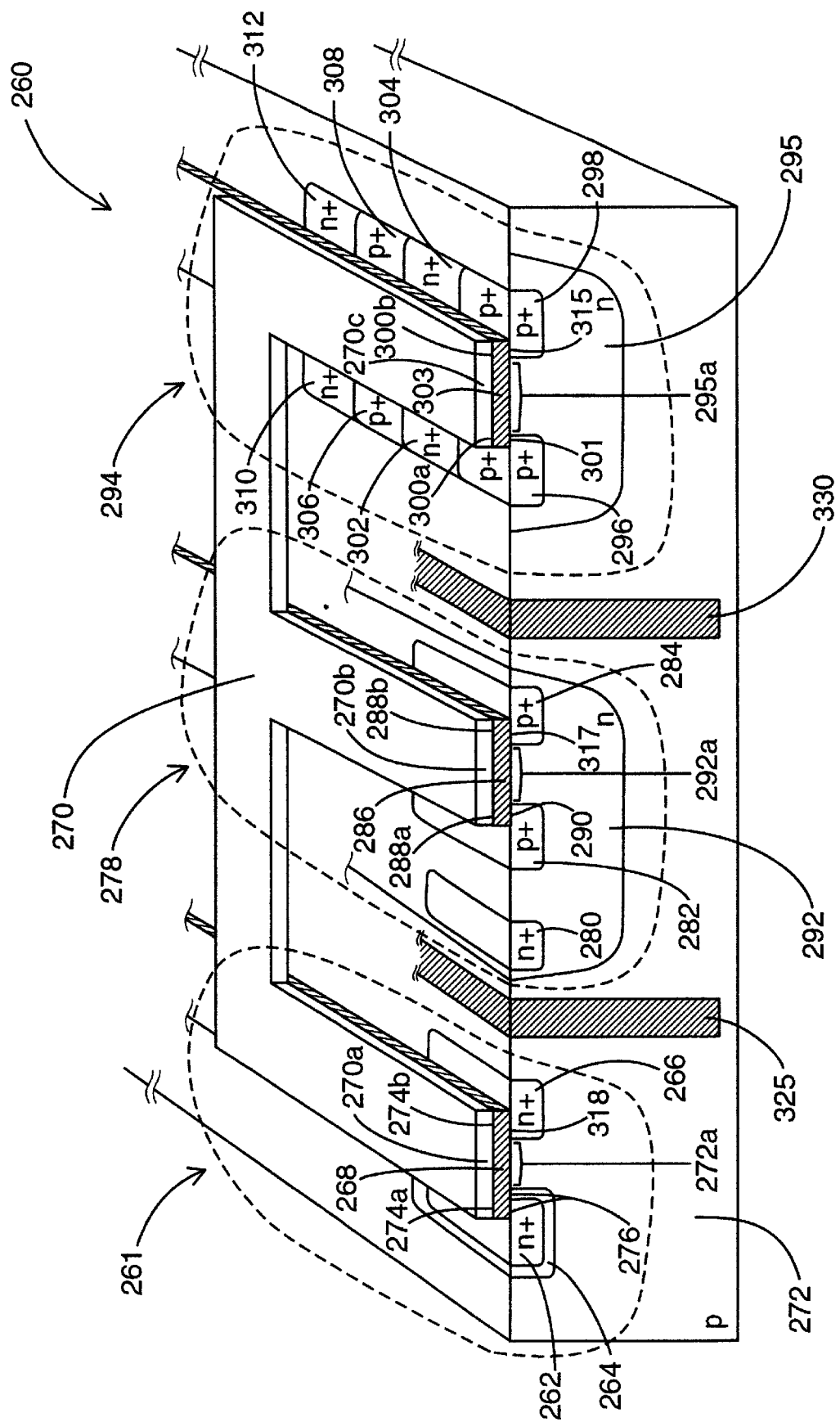
FIG. 8 shows a cross-section view of a memory device comprising an NMOS transistor, a first capacitive device and a second capacitive device with multiple voltage biasing regions.

FIG. 8 shows a further alternative embodiment of the present invention, wherein a memory cell 260 comprises an NMOS transistor 261, a first capacitive device 278 and a second capacitive device 294 with multiple injector regions. The NMOS transistor 261 is formed on a p type substrate 272 and includes an n+ source region 262 within an n− graded diffusion region 264, an n+ drain region 266 and a polysilicon floating gate structure 270a. Both the source 262 and drain regions 266 are separated by a p type channel region 272a, which is disposed below the floating gate structure 270a. A layer of gate oxide 268 in the range of 70 Angstroms thickness separates the floating gate 270a from the p type channel region 272a. A first edge portion 274a of the floating gate structure 270a overlaps the edge portion 276 of the n+ source region 262 and n− graded diffusion region 264, whilst the second edge portion 274b of the floating gate structure 270a overlaps the edge portion 318 of the n+ drain region 266.

The first capacitive device 278 is formed within a first n-well region 292 which is formed within the p type substrate 272. The first capacitive device 278 includes a first p+ injector region 282, a second p+ injector region 284, an n+ control gate region 280 and a polysilicon first floating structure 270b. Both the first and second p+ injector regions 282, 284 are separated by an n type channel region 292a, which is disposed below the first floating structure 270b. A gate oxide layer 286 in the range of 70 Angstroms thickness separates the capacitor first floating structure 270b from the n type channel region 292a. A first edge portion 288a of the first floating structure 270b overlaps the first edge portion 290 of the p+ injector region 282, whilst a second edge portion 288b of the first floating structure 270b overlaps the edge portion 317 of the second p+ injector region 284.

The second capacitive device 294 is formed within a second n-well region 295 which is formed within the p type substrate 272. The second capacitive device 294 includes a second pair of p+ injector regions 296, 298, a first pair of n+ diffusion regions 302, 304 directly adjacent to the second pair of p+ injector regions 296, 298, a third pair of p+ injector regions 306, 308 directly adjacent to the first pair of n+ diffusion regions 302, 304, a second pair of n+ diffusion regions 310, 312 directly adjacent to the third pair of p+ injector regions 306, 308 and a polysilicon second floating structure 270c. The third, fourth, fifth and sixth p+ injector regions 296, 298, 306, 308 and the first, second, third and fourth n+ diffusion regions 302, 304, 310, 312, are separated by an n type channel region 295a, which is disposed below the second floating structure 270c. A gate oxide layer 303 in the range of 70 Angstroms thickness separates the second floating structure 270c from the n type channel region 295a. A first edge portion 300a of the second floating structure 270c overlaps the edge portion 301 of the third p+ injector region 296, the first n+ diffusion region 302, the fifth p+ injector 306 region and the third n+ diffusion region 310. Also, the second edge 300b portion of the second floating structure 270c overlaps the edge portion 315 of the fourth p+ injector region 298, the second n+ diffusion region 304, the sixth p+ injector 308 region and the fourth n+ diffusion region 312.

The floating gate 270a and the capacitor top plate structures 270b, 270c are electrically connected and form a single polysilicon layer 270 which is electrically floating. Isolation regions 325, 330 are provided between the first capacitive device 278, second capacitive device 294 and transistor device 261.

The memory device 260 is programmed by applying a bias voltage of approximately 5 V to the first and second p+ injectors 282, 284 of the first capacitive device 278 and the control gate region 280 of the first capacitive device 278. The second capacitive device is biased by applying a voltage of approximately −5 V to the third, fourth, fifth and sixth p+ injector regions 296, 298, 306, 308, whilst a bias voltage of 0 V is applied to the first, second, third and fourth n+ diffusion regions 302, 304, 310, 312. The transistor device 261 source region 262 and drain region 266 are electrically floating during memory cell 260 programming. Programming is achieved by Zener Hot Electron injection through the gate oxide layer 303 of the second capacitive device 294 onto the second floating structure 270c and consequently the polysilicon structure 270. The advantage of this alternative embodiment compared to cell structures 50 and 80 is due to the use of multiple pairs of injector regions in the second capacitive device 294. Each Adjacent p+ and n+ region forms a reverse biased region that may cause zener programming of the device 260 due to zener breakdown across the p+ and n+ region junctions. Also, by applying a negative bias voltage to the third, fourth, fifth and sixth p+ injectors 296, 298, 306, 308, Zener Hot Electron injection occurs and electrons tunnel through the oxide region 303 onto the first and second floating structures 270c, 270b of the capacitive devices 294, 278 and floating gate 270a of the transistor device 261. By providing the multiple n+ and p+ regions, current flux is spread over a greater region which increases device reliability.

The memory cell 260 is erased by FN electron tunnelling from the transistor device floating gate 270a through the gate oxide region 268 to the source region 262. The erase operation is achieved by applying a negative bias voltage of approximately −5 V to the first capacitive device 278 p+ injectors 282, 284 whilst grounding the n+ control gate 280. The second capacitive device 294 third, fourth, fifth and sixth p+ injector regions 296, 298, 306, 308 are grounded or floating whilst the first, second, third and fourth n+ diffusion regions 302, 304, 310, 312 are either grounded or electrically floating. The drain region 266 of the transistor device 261 is electrically floating and a positive bias voltage of approximately 5 V is applied to the source region 262. The n− graded diffusion region 264 containing the source region 262, increases erase speed and device reliability of the memory device 260.

As previously discussed and known in the art, the read operation determines the absence (unprogrammed) or presence (programmed) of electrical charge in the memory cell. The read operation for this memory device 260 is achieved by applying a positive bias voltage in the range of 1–2 V to the first capacitive device 278 p+ injector regions 282, 284, the second capacitive device 294 n+ diffusion and p+ injector regions 302, 304, 310, 312, 296, 298, 306, 308 and the first capacitive device 278 n+ control gate region 280. Also a bias voltage in the range of 1–2 V is applied to the n+ drain region 266 and both the p substrate 272 and the source region 262 are grounded.

In accordance with the present invention, the p+ injectors 282, 284 can be independently biased in order to avoid gate (program) disturb in unselected cells during the programming operation. The gate (program) disturb occurs when a programmed unselected memory cell is erased due to a positive bias voltage being applied to both its control gate 280 and p+ injectors 282, 284. In order to avoid gate program disturb, the p+ injector regions 282, 284 of unselected memory cells are grounded. By grounding the p+ injectors, the bias voltage of approximately 5 V on the control gate of unselected memory cells does not undesirably erase them.

Figure 9:
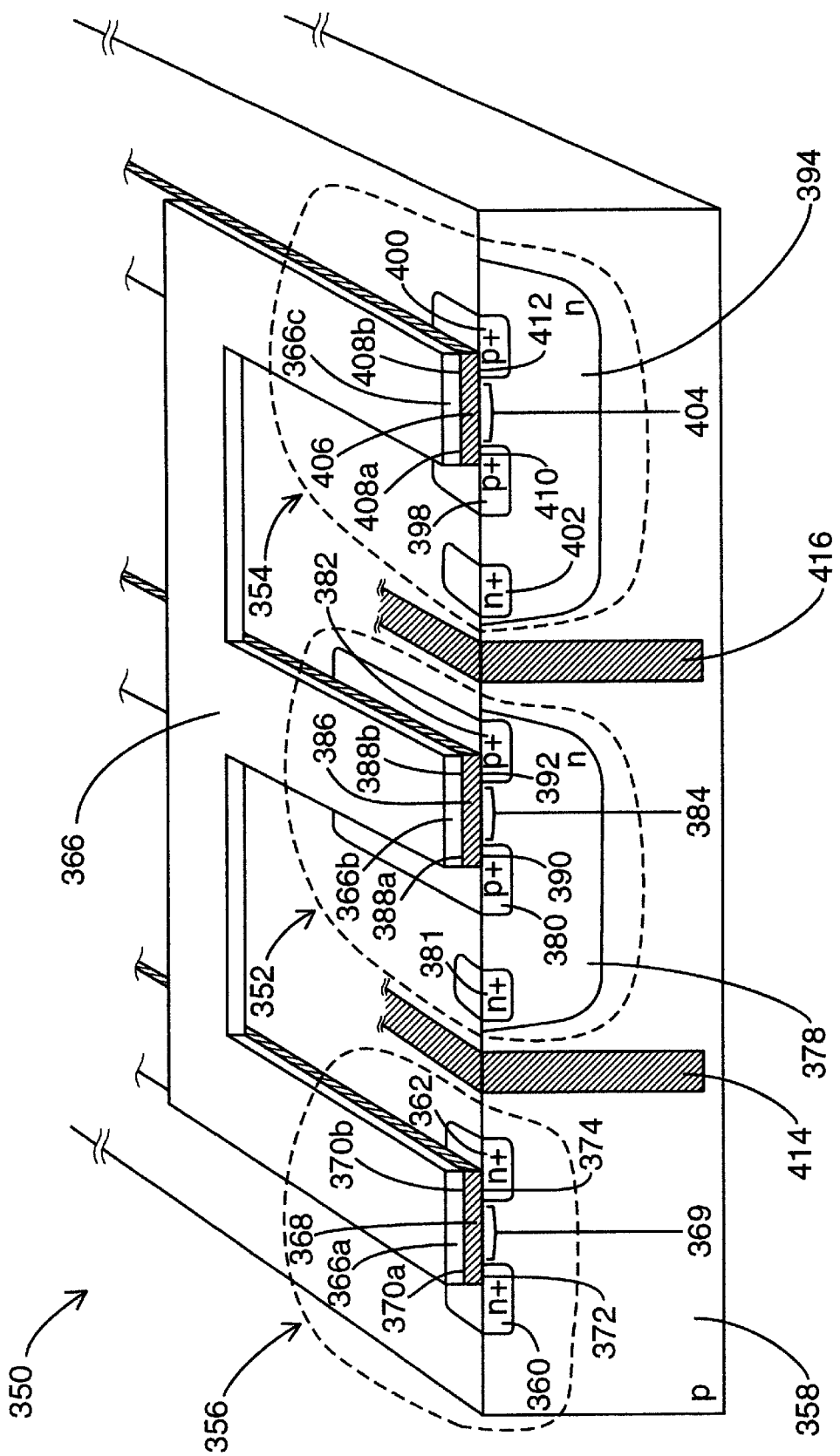
FIG. 9 shows a cross-section view of an alternative embodiment of the memory device of FIG. 2.

Memory cell 350 illustrated in FIG. 9 is an alternative embodiment of the present invention, and includes a first capacitive device 352, a second capacitive device 354 and an NMOS transistor device 356. The memory cell 350 is similar in structure to memory 50 illustrated in FIG. 2. However, the physical dimensions of the first and second capacitive device 352, 354 are varied in order to produce an increased capacitance magnitude for device 352 and a reduced capacitance magnitude for device 354. The NMOS transistor 356 is formed on a p type substrate 358 and includes an n+ source region 360, an n+ drain region 362 and a polysilicon floating gate structure 366a. Both the source 360 and drain region 362 are separated by a p type channel region 369, which is disposed below the floating gate structure 366a. A layer of gate oxide 368 in the range of 70 Angstroms thickness separates the floating gate 366a from the p type channel region 369. A first edge portion 370a of the floating gate structure 366a overlaps the edge portion 372 of the n+ source region 360, whilst a second edge portion 370b of the floating gate structure 366a overlaps the edge portion 374 of n+ drain region 362.

The first capacitive device 352 is formed within a first n-well region 378 which is formed within the p type substrate 358. The capacitive device 352 includes a first p+ injector region 380, a second p+ injector region 382, a first n+ control gate region 381 and a polysilicon first floating structure 366b. Both the first and second p+ injector regions 380, 382 are separated by an n type channel region 384, which is disposed below the capacitor first floating structure 366b. A first gate oxide layer 386 in the range of 70 Angstroms thickness separates the first floating structure 366b from the n type channel region 384. A first edge portion 388a of the capacitor first floating structure 366b overlaps the edge portion 390 of the first p+ injector region 380 whilst a second edge portion 388b of the first floating structure 366b overlaps the edge portion 392 of the second p+ injector region 382.

The second capacitive device 354 is formed within a second n-well region 394 which is formed within the p type substrate 358. The capacitive device 354 includes a third p+ injector region 398, a fourth p+ injector region 400, a second n+ control gate region 402 and polysilicon capacitor second floating structure 366c. Both the third and fourth p+ injector regions 398, 400 are separated by an n type channel region 404, which is disposed below the second floating structure 366c. A second gate oxide layer 406 in the range of 70 Angstroms thickness separates the second floating structure 366c from the n type channel region 404. A first edge portion 408a of the capacitor second floating structure 366c overlaps the edge portion 410 of the third p+ injector region 398, whilst a second edge portion 408b of the second floating structure 366c overlaps the edge portion 412 of the fourth p+ injector region 400. The first capacitive device 352 first floating structure 366b, the second capacitive device 354 second floating structure 366c and the NMOS transistor 356 floating gate region 366a share a single continuous polysilicon layer 366 which is electrically floating. The first capacitive device 352, second capacitive device 354 and transistor device 356 have isolation regions 414, 416 between them.

As illustrated in FIG. 9, the first and second p+ injector regions 380, 382 of first capacitive device 352 are longer in length than the third and fourth p+ injector regions 398, 400 of the second capacitive device 354. As a consequence of these injector regions being longer, they (380, 382) longitudinally extend by a greater length beneath the first floating structure 366b. This causes the channel region 384 beneath the first floating structure 366b to be wider and hence the capacitance magnitude of the first capacitive device 352 to be greater than that of the second capacitive device 354. The combined effect of having a first capacitive device 352 with a larger capacitive magnitude and a second capacitive device 354 with a smaller capacitive magnitude is to provide easier memory cell 350 erase operation using Fowler-Nordheim electron tunnelling.

The memory cell 350 is programmed using the band-to-band tunnelling (BTBT) method, wherein energetic electrons generated by BTBT tunnel through the oxide region 406 to the second floating structure 366c of the second capacitive device 354. Both the drain region 362 and source region 360 of the NMOS transistor device 356 are left floating or biased with a positive voltage. The p substrate 358 of the memory cell 350 is grounded. A bias voltage of approximately 5 V is applied to the first p+ injector region 380, the second p+ injector region 382 and the n+ control gate region 381 of the first capacitive device 352. This causes a large percentage of the approximately 5 V bias voltage to couple to the first floating structure 366b via the capacitive network formed between both the p+ injectors 380, 382, the first n-well region 378 and the first floating structure 366b. Most of the 5 V bias voltage is coupled to the first floating structure 366b due to the dominant capacitive coupling that occurs between the first n-well region 378 and the first floating structure 366b. By applying a bias voltage of approximately −5 V to p+ injector regions 398, 400 and grounding n-well 394 via the control gate region 402, depletion layers form under the second floating structure 366c, wherein the depletion layers form as a result of the reverse biased p+ injectors 398, 400 and n-well region 394. The depletion layers extend across the n-well channel region 404, eliminating the capacitance between the electrically floating second floating structure 366c and the second n-well region 394. Consequently, this causes increased voltage coupling to the second floating structure 366c by means of the capacitances formed between the overlapping portions, indicated at 408a, 410 and 408b, 412. These capacitances are relatively small and cause most of the bias voltage (−5 V) applied to the p+ injectors 398, 400 to drop across the oxide region 406. Consequently, only a small percentage of the coupling voltage is coupled to the second floating structure 366c. A large percentage of the 5 V bias voltage coupled to the first floating structure 366b of the first capacitive device 352 also appears on the second floating structure 366c of the second capacitive device 354. The combination of the negative bias on the p+ injectors and the positive coupled voltage on the floating gate results in energetic electron-hole pair generation in the reverse biased p+ injectors due to BTBT. The energetic electrons are attracted to the positively biased floating gate and are injected through the gate oxide and onto the floating gate. The injected electrons are stored on the electrically floating polysilicon region 366.

The memory cell 350 is erased using the Fowler-Nordheim method, wherein electrons tunnel from the floating gate structure 366c of the second capacitive device 354 through the oxide region 406 to the second n-well region 394. The memory cell 350 is erased by applying a bias voltage of approximately −5 V to the first and second p+ injector regions 380, 382 of the first capacitive device 352, whilst the first control gate region 381 is grounded. A bias voltage of approximately 5 V is also applied to the third and fourth p+ injector regions 398, 400 and the second control gate region 402 of the second capacitive device 354. The P substrate 358 of the memory cell 350 is grounded. The drain region 362 and the source region 360 of the NMOS transistor 356 are electrically floating during the erase operation of the memory cell 350. By applying the 5 V bias voltage to the second control gate 402 and the third and fourth p+ injector regions 398, 400 of the smaller second capacitive device 354, most of the 5 V is dropped across the second gate oxide layer 406. Consequently, only a small portion of the 5 V bias voltage applied to the p+ injector regions 398, 400 is coupled to the floating gate structure 366c. The larger first capacitive device 352 couples some of the −5 V bias voltage applied to its p+ injector regions 380, 382 to its first floating gate structure 366b and therefore the second floating gate structure 366c. This provides an electric field of 8–10 MV/cm across the second gate oxide region 406 of the smaller second capacitive device 354, which causes stored electrons on the floating structure 366 to Fowler-Nordheim tunnel to the n-well channel. In this way stored charge is removed from the floating structure 366 and the memory cell 350 is erased. In this embodiment of the present invention, programming and erasing is done by means of the capacitive devices 352, 354. The transistor device 356 is operated in order to detect the presence or absence of electrical charge during the read operation.

The read operation of the memory cell 350 is identical to that of memory cell 50 illustrated in FIG. 2, whereby a bias voltage in the range of 12 V is applied to the first p+ injector region 380, the second p+ injector region 382 and the n+ control gate region 381. Also, a 1–2 V bias voltage is applied to the third p+ injector region 398, the fourth p+ injector region 400, and the n+ control gate region 402 of the second capacitive device 354. A bias voltage in the range of 1–2 V is applied to the drain region 362 and both the P substrate 358 and the source region 360 are held at ground potential. If the floating gate 366a has no stored electrical charge, the applied bias voltages will turn the transistor device 356 'on' (above threshold) and electrons will flow in the p type channel region 368 between the drain 362 and source regions 360. Detection circuits will detect this current flow and convert it to a suitable logic level representing a data bit. Conversely, if the floating gate 366a has stored electrical charge, the applied bias voltages will not turn the transistor device 356 'on' (below threshold) and no electrons will flow in the p type channel region 368 between the drain 362 and source regions 360. The absence of detected current by the detection circuits will also be converted to a designated logic level that represents a data bit.

In accordance with the present invention, the p+ injectors 380, 382 can be independently biased in order to avoid gate (program) disturb in unselected cells during the programming operation. The gate (program) disturb occurs when a programmed unselected memory cell is erased due to a positive bias voltage being applied to both its control gate 381 and p+ injectors 380, 382. In order to avoid gate program disturb, the p+ injector regions 380, 382 of unselected memory cells are grounded. By grounding the p+ injectors, the bias voltage of approximately 5 V on the control gate of unselected memory cells does not undesirably erase them.

Figure 10:
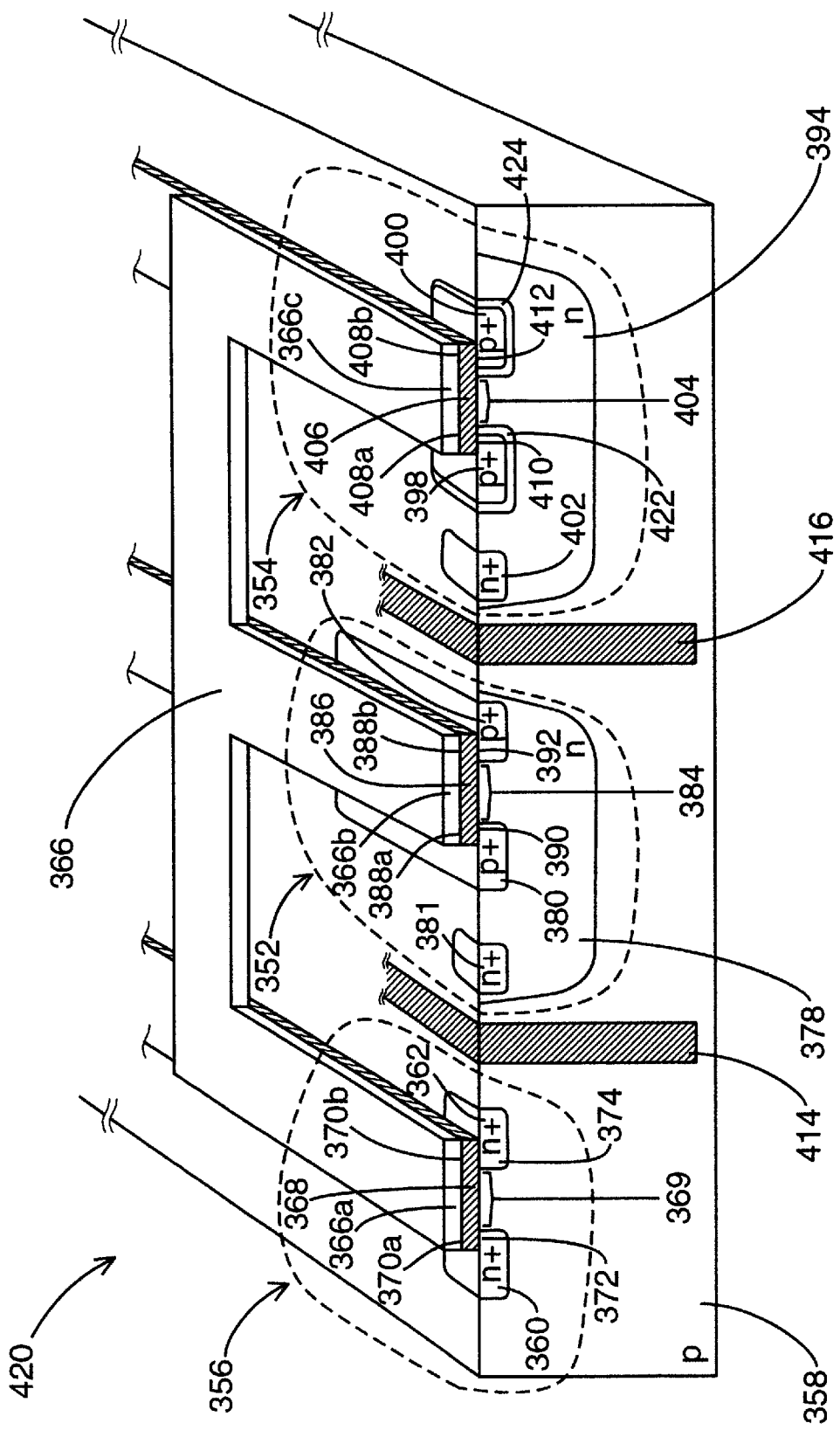
FIG. 10 shows a cross-section view of an alternative embodiment of the memory device of FIG. 3.

FIG. 10 shows yet another embodiment of the present invention. The applied voltage bias conditions associated with programming, erasing and reading memory cell 420, are identical to the memory cell previously described and illustrated in FIG. 9. Memory cell 420 differs from memory cell structure 350 only in that its second capacitive device 354 p+ injector regions 398, 400 are within n− graded diffusion regions 422 and 424 respectively. This enables the memory cell 420 to be programmed by BTBT and/or Zener Hot Electron injection. By nesting the p+ injectors 398, 400 within the n− graded diffusion regions 422, 424, programming speed is increased.

Figure 11:
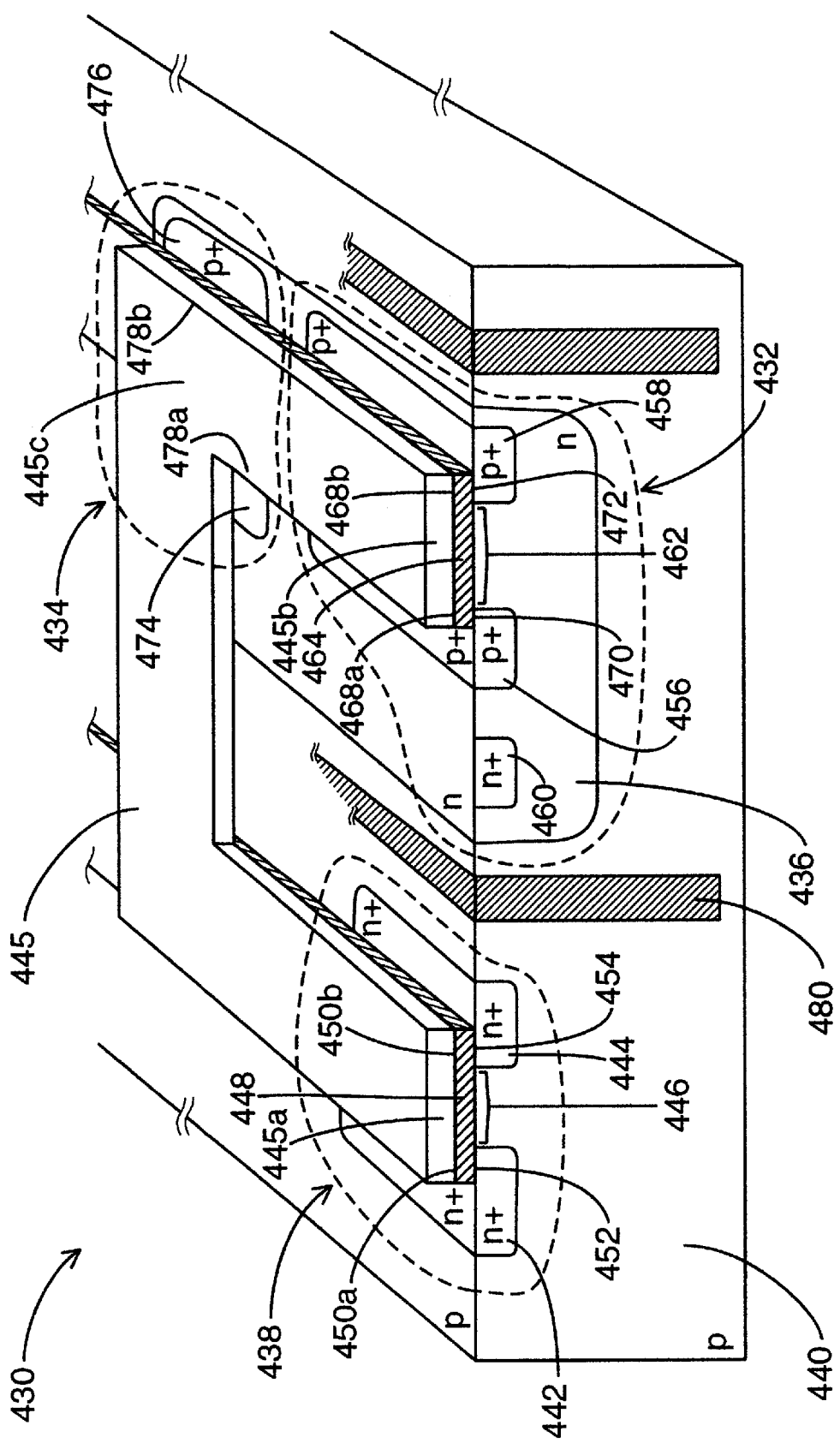
FIG. 11 shows a cross-section view of an alternative embodiment of the memory device of FIG. 4.

FIG. 11 illustrates an alternative aspect of the present invention, which closely resembles the memory cell illustrated in FIG. 4. Memory cell 430 comprises a first capacitive device 432 and a second capacitive device 434 that share the same n-well region 436, and an NMOS transistor device 438. The biasing conditions for program, erase and read operations of the memory cell 430 is identical to that of the previously described in memory cells 350, 420 illustrated in FIG. 9 and FIG. 10 respectively. The physical dimensions of the first and second capacitive device 432, 434 are varied in order to produce an increased capacitance magnitude and a reduced capacitance magnitude respectively. This is done in order to enhance the programming operation of the memory cell 430.

The NMOS transistor 438 is formed on a p type substrate 440 and includes an n+ source region 442, an n+ drain region 444 and a polysilicon floating gate structure 445a. Both the source and drain regions 442, 444 are separated by a p type channel region 446, which is disposed below the floating gate structure 445a. A layer of gate oxide 448 in the range of 70 Angstroms thickness separates the floating gate 445a from the p type channel region 446. A first edge portion 450a of the floating gate structure 445a overlaps the edge portion 452 of the n+ source region 442, whilst a second edge portion 450b of the floating gate structure 445a overlaps the edge portion 454 of the n+ drain region 444.

The first capacitive device 432 is formed within n-well region 436 which is formed within the p type substrate 440. The capacitive device 432 includes a first p+ injector region 456, a second p+ injector region 458, an n+ control gate region 460 and a polysilicon first floating structure 445b. Both the first and second p+ injector regions 456, 458 are separated by an n type channel region 462, which is disposed below the capacitor first floating structure 445b. A first gate oxide layer 464 in the range of 70 Angstroms thickness separates the capacitor device 432 first floating structure 445b from the n type channel region 462. A first edge portion 468a of the capacitor first floating structure 445b overlaps the edge portion 470 of the first p+ injector region 456, whilst the second edge portion 468b of the first floating structure 445b overlaps the edge portion 472 of the second p+ injector region 458.

The second capacitive device 434 is formed within the same n-well region 436 as the first capacitive device 432, wherein the second capacitive device 434 is longitudinally adjacent to the first capacitive device 432. The second capacitive device 434 includes a third p+ injector region 474, a fourth p+ injector region 476 and polysilicon second floating structure 445c. The n+ control gate region 460 is common to both capacitive devices 432, 434 and provides voltage biasing to the common n-well region 436. Both the third and fourth p+ injector regions 474, 476 are separated by an n type channel region, (not shown) which is disposed below the capacitor device 434 second floating structure 445c. A second gate oxide layer (not shown) in the range of 70 Angstroms thickness separates the second floating structure 445c from the n type channel region. A first edge portion 478a of the second floating structure 445c overlaps the edge portion (not shown) of the third p+ injector region 474, whilst the second edge portion 478b of the second floating structure 445c overlaps the edge portion (not shown) of the fourth p+ injector region 476. The first capacitive device 432 first floating structure 445b, the second capacitive device 434 second floating structure 445c and the NMOS transistor 438 floating gate region 445a share a single continuous polysilicon layer 445 which is electrically floating. The first capacitive device and second capacitive devices 432, 434 and the transistor device 438 have an isolation region 480 between them. In this aspect of the present invention, the first capacitive device 432 has a larger capacitance magnitude relative to the second capacitive device 434. The first and second p+ injector regions 456, 458 of first capacitive device 432 are longer in length than the third and fourth p+ injector regions 474, 476 of the second capacitive device 434. This causes the channel region 462 beneath the first floating structure 445b to be wider and hence the capacitance magnitude of the first capacitive device 432 to be greater than that of the second capacitive device 434. The combined effect of having a first capacitive device 432 with a larger capacitive magnitude and a second capacitive device 434 with a smaller capacitive magnitude is to provide easier memory cell 430 erase operation using Fowler-Nordheim electron tunnelling. Stored charge on floating structure 445 is therefore discharged through the second capacitive device 434 to the n-well channel.

Memory device 430 programming is achieved by applying a bias voltage of approximately 5 V to the first and second p+ injectors 456, 458 of the first capacitive device 432 and the control gate region 460 of the n-well 436. A voltage of approximately −5 V is applied to the third and fourth p+ injectors 474, 476 of the second capacitive device 434, whilst the drain and source region 444, 442 of the transistor 438 are electrically floating or positively biased. Consequently, programming is achieved by Band-To-Band-Tunnelling (BTBT) of electrons through the oxide region of the second capacitive device 434 to second floating structure 445c and hence floating structure 445.

The read operation for this memory device 430 is achieved by applying a 1–2 V bias voltage to the first p+ injector region 456, the second p+ injector region 458 and the n+ control gate region 460 and/or a 1–2 V bias voltage is applied to the third p+ injector region 474 and fourth p+ injector region 476 of the second capacitive device 434. A bias voltage in the range of 1–2 V is applied to the drain region 444 and both the P substrate 440 and the source region 442 are held at ground potential. The read operation follows the same operation procedure as previously described and known in the art.

The memory cell 430 is erased using the Fowler-Nordheim method, wherein electrons tunnel from the floating gate structure 445c of the second capacitive device 434 through the oxide region to the n-well region 436. The memory cell 430 is erased by applying a bias voltage of approximately −5 V to the first and second p+ injector regions 456, 458 of the first capacitive device 432, whilst the control gate region 460 is biased to 5 V. A bias voltage of approximately 5 V is also applied to the third and fourth p+ injector regions 474, 476 of the second capacitive device 434. The P substrate 440 of the memory cell 430 is grounded. The drain region 444 and the source region 442 of the NMOS transistor 438 are electrically floating during the erase operation of the memory cell 430. By applying the 5 V bias voltage to the third and fourth p+ injector regions 474, 476 of the smaller second capacitive device 434 and the control gate 460, most of the 5 V is dropped across the second gate oxide layer (not shown in FIG. 11). Consequently, only a small portion of the 5 V bias voltage applied to the p+ injector regions 474, 476 is coupled to the floating gate structure 445c. The larger first capacitive device 432 couples a portion of the −5 V bias voltage applied to its p+ injector regions 456, 458 to its first floating gate structure 445b and therefore the second floating gate structure 445c. This provides an electric field of 8–10 MV/cm across the second gate oxide region (not shown in FIG. 11) of the smaller second capacitive device 434, which causes stored electrons on the floating structure 445 to Fowler-Nordheim tunnel to the n-well channel. In this way stored charge is removed from the floating structure 445 and the memory cell 430 is erased. In this embodiment of the present invention, programming and erasing is done by means of the capacitive devices 432, 434. The transistor device 438 is operated in order to detect the presence or absence of electrical charge during the read operation.

In accordance with the present invention, the p+ injectors 456, 458 can be independently biased in order to avoid gate (program) disturb in unselected cells during the programming operation. The gate (program) disturb occurs when a programmed unselected memory cell is erased due to a positive bias voltage being applied to both its control gate 460 and p+ injectors 456, 458. In order to avoid gate program disturb, the p+ injector regions 456, 458 of unselected memory cells are grounded. By grounding the p+ injectors, the bias voltage of approximately 5 V on the control gate of unselected memory cells does not undesirably erase them.

Figure 12:
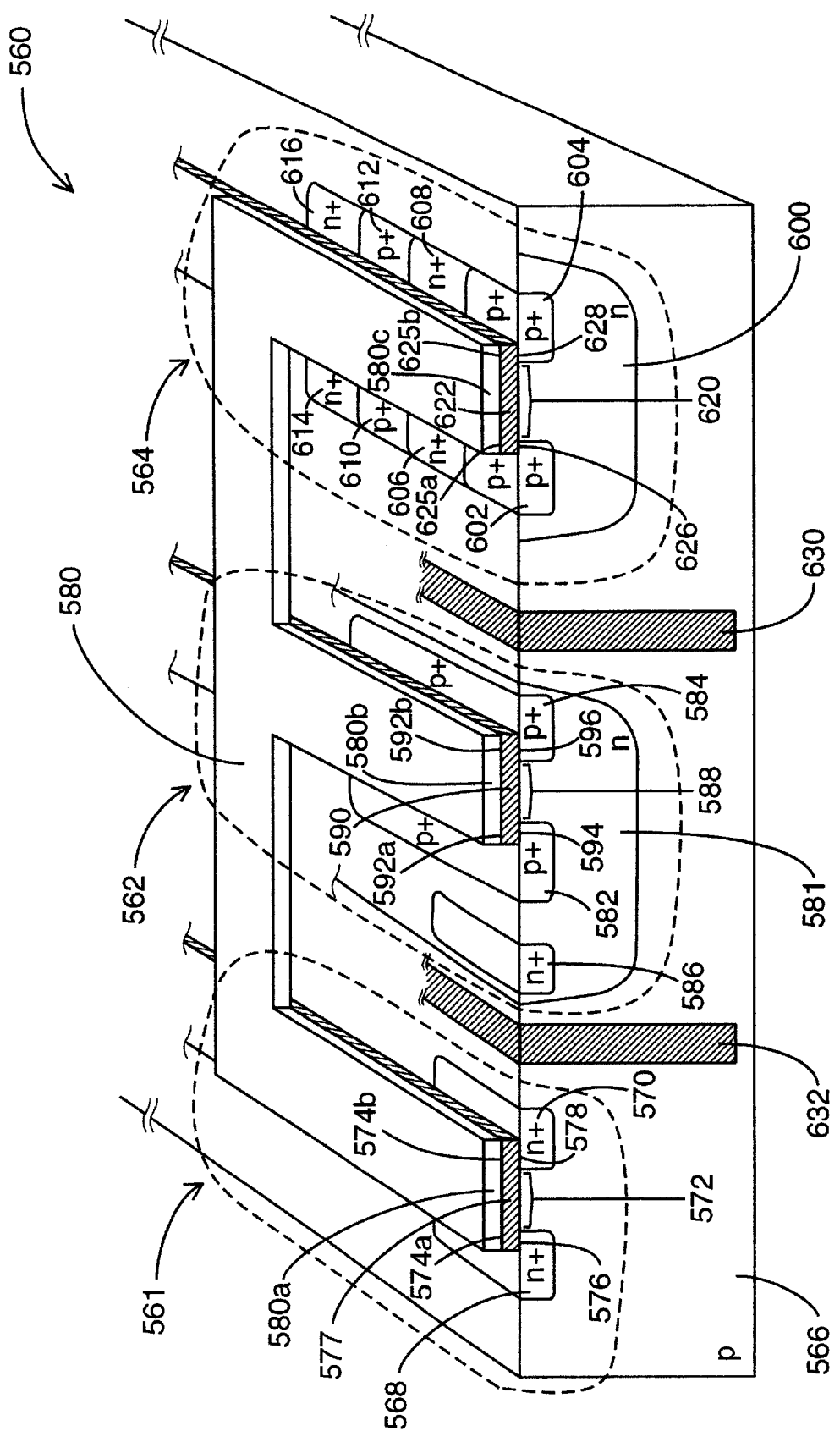
FIG. 12 shows a cross-section view of an alternative embodiment of the memory device of FIG. 8.

FIG. 12 shows a memory cell 560 which is similar in structure to memory cell 260 illustrated in FIG. 8. Memory cell 560 comprises an NMOS transistor 561, a first capacitive device 562 and a second capacitive device 564 with multiple injector regions. The NMOS transistor 561 is formed on a p type substrate 566 and includes an n+ source region 568, an n+ drain region 570 and a polysilicon floating gate structure 580a. Both the source 568 and drain regions 570 are separated by a p type channel region 572, which is disposed below the floating gate structure 580a. A layer of gate oxide 577 in the range of 70 Angstroms thickness separates the floating gate 580a from the p type channel region 572. A first edge portion 574a of the floating gate structure 580a overlaps the edge portion 576 of the n+ source region 568, whilst the second edge portion 574b of the floating gate structure 580a overlaps the edge portion 578 of the n+ drain region 570.

The first capacitive device 562 is formed within a first n-well region 581 which is formed within the p type substrate 566. The first capacitive device 562 includes a first p+ injector region 582, a second p+ injector region 584, an n+ control gate region 586 and a polysilicon first floating structure 580b. Both the first and second p+ injector regions 582, 584 are separated by an n type channel region 588, which is disposed below the first floating structure 580b. A gate oxide layer 590 in the range of 70 Angstroms thickness separates the capacitor first floating structure 580b from the n type channel region 588. A first edge portion 592a of the first floating structure 580b overlaps the first edge portion 594 of the p+ injector region 582, whilst a second edge portion 592b of the first floating structure 580b overlaps the edge portion 596 of the second p+ injector region 584.

The second capacitive device 564 is formed within a second n-well region 600 which is formed within the p type substrate 566. The second capacitive device 564 includes a second pair of p+ injector regions 602, 604, a first pair of n+ diffusion regions 606, 608 directly adjacent to the second pair of p+ injector regions 602, 604, a third pair of p+ injector regions 610, 612 directly adjacent to the first pair of n+ diffusion regions 606, 608, a second pair of n+ diffusion regions 614, 616 directly adjacent to the third pair of p+ injector regions 610, 612 and a polysilicon second floating structure 580c. The third, fourth, fifth and sixth p+ injector regions 602, 604, 610, 612 and the first, second, third and fourth n+ diffusion regions 606, 608, 614, 616, are separated by an n type channel region 620, which is disposed below the second floating structure 580c. A gate oxide layer 622 in the range of 70 Angstroms thickness separates the second floating structure 580c from the n type channel region 620. A first edge portion 625a of the second floating structure 580c overlaps the edge portion 626 of the third p+ injector region 602, the first n+ diffusion region 606, the fifth p+ injector 610 region and the third n+ diffusion region 614. Also, the second edge 625b portion of the second floating structure 580c overlaps the edge portion 628 of the fourth p+ injector region 604, the second n+ diffusion region 608, the sixth p+ injector 612 region and the fourth n+ diffusion region 616.

The floating gate 580a and the capacitor top plate structures 580b, 580c are electrically connected and form a single polysilicon layer 580 which is electrically floating. Isolation regions 630, 632 are provided between the first capacitive device 562, second capacitive device 564 and transistor device 561.

The memory device 560 is programmed by applying a bias voltage of approximately 5 V to the first and second p+ injectors 582, 584 of the first capacitive device 562 and the control gate region 586 of the first capacitive device 562. The second capacitive device 564 is biased by applying a voltage of approximately −5 V to the third, fourth, fifth and sixth p+ injector regions 602, 604, 610, 612, whilst a bias voltage of 0 V is applied to the first, second, third and fourth n+ diffusion regions 606, 608, 614, 616. The transistor device 561 source region 568 and drain region 570 are electrically floating during memory cell 560 programming. Programming is achieved by Zener Hot Electron injection through the gate oxide layer 622 of the second capacitive device 564 onto the second floating structure 580c and consequently the polysilicon structure 580. The advantage of this alternative embodiment compared to cell structures 350 and 420 is due to the use of multiple pairs of injector regions in the second capacitive device 564. Each Adjacent p+ and n+ region forms a reverse biased region that may cause zener programming of the device 560 due to zener breakdown across the p+ and n+ region junctions. Also, by applying a negative bias voltage to the third, fourth, fifth and sixth p+ injectors 602, 604, 610, 612, Zener Hot Electron injection occurs and electrons tunnel through the oxide region 622 onto the first and second floating structures 580b, 580c of the capacitive devices 562, 564 and floating gate 580a of the transistor device 561. By providing the multiple n+ and p+ regions, current flux is spread over a greater region which increases device reliability.

The memory cell 560 is erased by FN electron tunnelling from the second capacitor device 564 second floating structure 580c through the gate oxide region 622 to the n-well region 600. The erase operation is achieved by applying a negative bias voltage of approximately −5 V to the first capacitive device 562 p+ injectors 582, 584 whilst grounding the n+ control gate 586. A positive bias voltage of approximately 5 V is applied to the second capacitive device 564 third, fourth, fifth and sixth p+ injector regions 602, 604, 610, 612, whilst the first, second, third and fourth n+ diffusion regions 606, 608, 614, 616 are also biased to 5 V. The drain region 570 and source region 568 of the transistor device 561 are electrically floating or grounded. As previously described in conjunction with the memory cell devices illustrated in FIGS. 9–12, the increased capacitance magnitude of the first capacitor device 562 compared to the magnitude of the second capacitor device 564 provides enough electrical field potential across oxide region 622 to achieve Fowler-Nordheim tunnelling of electrical charge from the gate structure 580c to the n-well region 600.

As previously discussed and known in the art, the read operation determines the absence (unprogrammed) or presence (programmed) of electrical charge in the memory cell. The read operation for this memory device 560 is achieved by applying a positive bias voltage in the range of 1–2 V to the first capacitive device 562 p+ injector regions 582, 584, the second capacitive device 564 n+ diffusion and p+ injector regions 602, 604, 606, 608, 610, 612, 614, 616 and the first capacitive device 562 n+ control gate region 586. Also a bias voltage in the range of 1–2 V is applied to the n+ drain region 570 and both the p substrate 566 and the source region 568 are grounded.

In accordance with the present invention, the p+ injectors 582, 584 can be independently biased in order to avoid gate (program) disturb in unselected cells during the programming operation. The gate (program) disturb occurs when a programmed unselected memory cell is erased due to a positive bias voltage being applied to both its control gate 586 and p+ injectors 582, 584. In order to avoid gate program disturb, the p+ injector regions 582, 584 of unselected memory cells are grounded. By grounding the p+ injectors, the bias voltage of approximately 5 V on the control gate of unselected memory cells does not undesirably erase them.

It will be appreciated that in accordance with the present invention, the embodiments of FIGS. 9–13 have the advantage of not requiring an ESD/N-graded diffusion in the source region of their respective transistor devices. This both simplifies and reduces the processing costs (i.e. only a baseline process required). Furthermore, these embodiments enable higher reliability during the erase process, whereby hot hole injection into the transistor device gate oxide is eliminated.

The embodiments of the present invention offer single layer polysilicon EEPROM memory cells that can be fabricated on a baseline deep sub-micron CMOS process that operate at program and erase voltages of approximately 5 V. Also, the memory cells comprise capacitive devices with injector regions that enable BTBT program and FN erase operations and reduce gate disturb mechanisms. The various embodiments show memory cells with various structures, wherein the structures vary as a function of size, fabrication complexity and power consumption.

It should be understood that various modifications can be made to the preferred and alternative embodiments described and illustrated herein, without departing from the present invention, the scope of which is defined in the appended claims.

We claim:

1. An EEPROM memory cell, said memory cell comprising:
   (a) a transistor device formed on a first conductivity type semiconductor substrate, said transistor comprising:
      an electrically floating gate structure, a source region within a graded diffusion region, and a drain region;
   (b) a capacitive device formed on a second conductivity type semiconductor substrate, said capacitive device comprising:
      first and second injector regions of third conductivity type, a channel region of second conductivity type separating said first and second injector regions, and
      a first electrically floating structure disposed above said channel region, wherein a first edge portion of said floating structure overlaps a portion of said first injector region and a second edge portion of said first floating structure overlaps a portion of said second injector region, and
      a control gate region of fourth conductivity type located within said second conductivity type semiconductor substrate;
   (c) said gate structure and said first floating structure being electrically connected together;
   wherein said transistor device and capacitive device are capable of receiving bias voltages for electrically programming, electrically erasing and electrically reading said memory cell.

2. The EEPROM memory cell of claim 1, wherein said gate structure and said first floating structure comprise a common polysilicon member.

3. The EEPROM memory cell of claim 1, wherein said source and drain regions are n+ type.

4. The EEPROM memory cell of claim 1, wherein said graded diffusion region is an n− type diffusion region.

5. The EEPROM memory cell as defined in claim 1, wherein said first conductivity type is p, said second conductivity type is n, said third conductivity type is p+ and said fourth conductivity type is n+.

6. The Flash EEPROM memory cell of claim 1, further comprising a second capacitive device within said second conductivity type semiconductor substrate, wherein said second capacitive device comprises:
   a third and fourth injector region of third conductivity type, a second channel region of second conductivity type separating said third and fourth injector regions, and
   a second electrically floating structure disposed above said second channel region, wherein a first edge portion of said second floating structure overlaps a portion of said third injector region and a second edge portion of said second floating structure overlaps a portion of said fourth injector region; and
   said first injector region of said first capacitive device and said third injector region of said second capacitive device are separated by a region of said second conductivity type semiconductor substrate; and
   said second injector region of said first capacitive device and said fourth injector region of said second capacitive device are separated by a region of said second conductivity type semiconductor substrate; and
   said first and second floating structures and said gate structure being electrically connected together.

7. The EEPROM memory cell as defined in claim 6, wherein said EEPROM memory cell is adapted to receive bias voltages for providing programming by means of band-to-band-tunnelling at said second capacitive device.

8. The EEPROM memory cell of claim 6, wherein said first and second floating structures and said gate structure comprise a common polysilicon member.

9. The EEPROM memory cell as defined in claim 6, wherein said first conductivity type is p, said second conductivity type is n and said third conductivity is p+.

10. The Flash EEPROM memory cell of claim 1, further comprising a second capacitive device within said first conductivity type semiconductor substrate, wherein said second capacitive device comprises:
    a third injector region of third conductivity type within a first graded diffusion region and a fourth injector region of third conductivity type within a second diffusion region, a second channel region of first conductivity type separating said third injection region within said diffusion region and said fourth injector region within second diffusion region; and
    a second electrically floating structure disposed above said second channel region of first conductivity type, wherein a first edge portion of said second floating structure overlaps a portion of said third injector region and a second edge portion of said second floating structure overlaps a portion of said fourth injector region; and
    said third injector regions of said second capacitive device and said source region of said transistor device are separated by a region of said first conductivity type semiconductor substrate; and
    said fourth injector region of said second capacitive device and said drain region of said transistor device are separated by a region of said first conductivity type semiconductor substrate; and
    said first and second floating structures and said gate structure being electrically connected together.

11. The EEPROM memory cell as defined in claim 10 or 6 wherein said EEPROM memory cell is adapted receive bias voltages for providing programming by band-to-band-tunnelling at said second capacitive device.

12. The EEPROM memory cell of claim 10, wherein said first and second floating structures and said gate structure comprise a common polysilicon member.

13. The EEPROM memory cell as defined in claim 10, wherein said first conductivity type is p, said second conductivity type is n and said third conductivity type is p+.

14. The EEPROM memory cell as defined in claim 10, wherein said first graded diffusion region and said second graded diffusion region are n− type.

15. The Flash EEPROM memory cell of claim 1 wherein said drain region has first and second sides, the first mentioned source region being spaced from said first side of said drain region, said memory cell further comprising:
   (a) a second source of fourth conductivity type, said second source region being spaced from said second side of said drain region with said drain region being between said first mentioned and said second source regions, and a second channel region of first conductivity type between said second source region and said drain region;
   (b) a second electrically floating gate structure disposed above said second channel region, a first edge portion of said second gate structure overlapping a portion of said second source region and a second edge portion of said second gate structure overlapping a portion of said drain region; and (c) said second gate structure, the first mentioned gate structure and said floating structure being electrically connected.

16. The EEPROM memory cell of claim 15, wherein said floating structures and said gate structure comprise a common polysilicon member.

17. The EEPROM memory cell as defined in claim 15, wherein said first conductivity type is p, said second conductivity type is n and said fourth conductivity is n+.

18. The EEPROM memory cell of claim 1, said memory cell further comprising:
   (a) a graded diffusion region, wherein said drain region being nested within said graded diffusion region; and
   (b) a contact region within said graded diffusion region.

19. The EEPROM memory cell of claim 18, wherein said source is of n+ type.

20. The EEPROM memory cell of claim 18, wherein said drain is of p+ type.

21. The EEPROM memory cell of claim 18, wherein said graded diffusion region is an n– type diffusion region.

22. The EEPROM memory cell of claim 18, wherein said contact region is of n+ type.

23. The EEPROM memory cell as defined in claim 18, wherein said EEPROM memory cell is adapted to receive bias voltages for providing programming by band-to-band-tunnelling at said second capacitive device.

24. A Flash EEPROM memory cell, said memory cell comprising:
   (a) a transistor device formed on a first conductivity type semiconductor substrate, said transistor comprising:
      an electrically floating gate structure, a source region of second conductivity type within a graded diffusion region and a drain region of second conductivity type;
   (b) a first capacitive device formed on a second semiconductor substrate region of second conductivity type, said capacitive device comprising:
      first and second injector regions of third conductivity type, a first channel region of second conductivity type separating said first and second injector regions, and
      a first electrically floating structure disposed above said first channel region, wherein a first edge portion of said first structure overlaps a portion of said first injector region and a second edge portion of said first structure overlaps a portion of said second injector region, and
      a first control gate region of fourth conductivity type located within said second semiconductor substrate region; and
   (c) a second capacitive device formed on a third semiconductor substrate region of said second conductivity type, said second capacitive device comprising:
      third and fourth injector regions of said third conductivity type, a second channel region of said second conductivity type separating said third and fourth injector regions, and a second electrically floating structure disposed above said second channel region, wherein a first edge portion of said second structure overlaps a portion of said third injector region and a second edge portion of said second structure overlaps a portion of said fourth injector region, and
      a second control gate region of fourth conductivity type located within said third semiconductor substrate region; and
      said gate structure and said first and second structures being electrically connected together.

wherein said transistor device, first capacitive device and second capacitive device are capable of receiving bias voltages for electrically programming, electrically erasing and electrically reading said memory cell.

25. The EEPROM memory cell of claim 24, wherein said gate structure and said first and second polysilicon structures comprise a common polysilicon member.

26. The EEPROM memory cell of claim 24, wherein said graded diffusion region is an n– type diffusion region.

27. The EEPROM memory cell as defined in claim 24, wherein said first conductivity type is p, said second conductivity type is n, said third conductivity type is p+ and said fourth conductivity type is n+.

28. The EEPROM memory cell as defined in claim 24, wherein said EEPROM memory cell is adapted to receive bias voltages for providing programming by means of band-to-band-tunnelling at said second capacitive device.

29. The EEPROM memory cell as defined in claim 24, wherein said second capacitive device includes a first n– graded diffusion region which surrounds said first injector region.

30. The EEPROM memory cell as defined in claim 24 wherein said second capacitive device includes a second n– graded diffusion region which surrounds said second injector region.

31. The EEPROM memory cell of claim 24, wherein said second capacitive device further comprises:
   a first diffusion region of fourth conductivity type adjacent to said third injector region of third conductivity type and a second diffusion region of fourth conductivity type adjacent to said fourth injector region of third conductivity type, said second channel region separating said first and second diffusion regions, and said second electrically floating structure disposed above said second channel region, wherein a first edge portion of said second floating structure overlaps a portion of said first diffusion region and a second edge portion of said second floating structure overlaps a portion of said second diffusion region; and
   a fifth injector region of third conductivity type adjacent to said first diffusion region and a sixth injector region of third conductivity type adjacent to said second diffusion region, said second channel region separating said fifth and sixth injector regions of third conductivity type and said second electrically floating structure disposed above said second channel region, wherein a first edge portion of said second floating structure overlaps a portion of said fifth injector region and a second edge portion of said second floating structure overlaps a portion of said sixth injector region; and
   a third diffusion region of fourth conductivity type adjacent to said fifth injector region of third conductivity type and a fourth diffusion region of fourth conductivity type adjacent to said sixth injector region of third conductivity type, said second channel region separating said third and fourth diffusion regions of fourth conductivity type and said second electrically floating structure disposed above said second channel region, wherein a first edge portion of said second floating structure overlaps a portion of said third diffusion region and a second edge portion of said second floating structure overlaps a portion of said fourth diffusion region.

32. The EEPROM memory cell of claim 31, wherein said first conductivity type is p, said second conductivity type is n, said third conductivity type is p+ and said fourth conductivity type is n+.

33. The EEPROM memory cell of claim 31, wherein said EEPROM memory cell is adapted to receive bias voltages for providing programming by zener hot electron injection at said second capacitive device.

34. A Flash EEPROM memory cell, said memory cell comprising:
(a) a transistor device formed on a first conductivity type semiconductor substrate, said transistor comprising:
an electrically floating gate structure, a source region of second conductivity type and a drain region of second conductivity type;
(b) a first capacitive device formed on a second semiconductor substrate region of second conductivity type, said capacitive device comprising:
first and second injector regions of third conductivity type, a first channel region of second conductivity type separating said first and second injector regions, and
a first electrically floating structure disposed above said first channel region, wherein a first edge portion of said first structure overlaps a portion of said first injector region and a second edge portion of said first structure overlaps a portion of said second injector region, and
a first control gate region of fourth conductivity type located within said second semiconductor substrate region; and
(c) a second capacitive device formed on a third semiconductor substrate region of said second conductivity type, said second capacitive device comprising:
third and fourth injector regions of said third conductivity type, a second channel region of said second conductivity type separating said third and fourth injector regions, and a second electrically floating structure disposed above said second channel region, wherein a first edge portion of said second structure overlaps a portion of said third injector region and a second edge portion of said second structure overlaps a portion of said fourth injector region, and
a second control gate region of fourth conductivity type located within said third semiconductor substrate region; and
said gate structure and said first and second structures being electrically connected together,
wherein said transistor device, first capacitive device and second capacitive device are capable of receiving bias voltages for electrically programming, electrically erasing and electrically reading said memory cell.

35. The EEPROM memory cell as defined in claim 34, wherein said EEPROM memory cell device is adapted to receive bias voltages for providing programming by band-to-band-tunnelling at said second capacitive device.

36. The EEPROM memory cell as defined in claim 34, wherein said EEPROM memory cell device is adapted to receive bias voltages for providing erasing by means of Fowler-Nordheim tunnelling at said second capacitive device.

37. The EEPROM memory cell as defined in claim 34, wherein said second capacitive device includes a first n– graded diffusion region which surrounds said first injector region.

38. The EEPROM memory cell as defined in claim 34 wherein said second capacitive device includes a second n– graded diffusion region which surrounds said second injector region.

39. The EEPROM memory cell of claim 34, wherein said gate structure and said first and second polysilicon structures comprise a common polysilicon member.

40. The EEPROM memory cell of claim 34, wherein said first conductivity type is p, said second conductivity type is n, said third conductivity type is p+ and said fourth conductivity type is n+.

41. The EEPROM memory cell of claim 34, wherein said first and second injector regions of said first capacitive device are adapted to longitudinally extend by a first length beneath said first electrically floating structure.

42. The EEPROM memory cell of claim 41, wherein said third and fourth injector regions of said second capacitive device are adapted to longitudinally extend by a second length beneath said second electrically floating structure.

43. The EEPROM memory cell of claim 42, wherein said first length is substantially longer than said second length.

44. The EEPROM memory cell of claim 34, wherein said first capacitive device has a first capacitance magnitude and said second capacitive device has a second capacitance magnitude.

45. The EEPROM memory cell of claim 44, wherein said first capacitance magnitude is larger than said second capacitance magnitude.

46. The EEPROM memory cell of claim 34, wherein said second capacitive device further comprises:
a first diffusion region of fourth conductivity type adjacent to said third injector region of third conductivity type and a second diffusion region of fourth conductivity type adjacent to said fourth injector region of third conductivity type, said second channel region separating said first and second diffusion regions, and said second electrically floating structure disposed above said second channel region, wherein a first edge portion of said second floating structure overlaps a portion of said first diffusion region and a second edge portion of said second floating structure overlaps a portion of said second diffusion region; and
a fifth injector region of third conductivity type adjacent to said first diffusion region and a sixth injector region of third conductivity type adjacent to said second diffusion region, said second channel region separating said fifth and sixth injector regions of third conductivity type and said second electrically floating structure disposed above said second channel region, wherein a first edge portion of said second floating structure overlaps a portion of said fifth injector region and a second edge portion of said second floating structure overlaps a portion of said sixth injector region; and
a third diffusion region of fourth conductivity type adjacent to said fifth injector region of third conductivity type and a fourth diffusion region of fourth conductivity type adjacent to said sixth injector region of third conductivity type, said second channel region separating said third and fourth diffusion regions of fourth conductivity type and said second electrically floating structure disposed above said second channel region, wherein a first edge portion of said second floating structure overlaps a portion of said third diffusion region and a second edge portion of said second floating structure overlaps a portion of said fourth diffusion region.

47. The EEPROM memory cell of claim 46, wherein said first conductivity type is p, said second conductivity type is n, said third conductivity type is p+ and said fourth conductivity type is n+.

48. The EEPROM memory cell as defined in claim 46, wherein said EEPROM memory cell device is adapted to receive bias voltages for providing programming by band-to-band tunneling to said second capacitive device.

49. The EEPROM memory cell as defined in claim 46, wherein said EEPROM memory cell device is adapted to receive bias voltages for providing erasing by Fowler-Nordheim tunneling at said second capacitive device.

50. The EEPROM memory cell of claim 46, wherein said first and second injector regions of said first capacitive device are adapted to longitudinally extend by a first length beneath said first electrically floating structure.

51. The EEPROM memory cell of claim 48, wherein said third, fourth, fifth and sixth injector regions of said second capacitive device are adapted to each longitudinally extend by a second length beneath said second electrically floating structure.

52. The EEPROM memory cell of claim 49, wherein said first length is substantially longer than said second length.

53. The EEPROM memory cell of claim 46, wherein said first capacitive device has a first capacitance magnitude and said second capacitive device has a second capacitance magnitude.

54. The EEPROM memory cell of claim 53, wherein said first capacitance magnitude is larger than said second capacitance magnitude.

55. A Flash EEPROM memory cell, said memory cell comprising:
(a) a transistor device formed on a first conductivity type semiconductor substrate, said transistor comprising:
an electrically floating gate structure, a source region of second conductivity type and a drain region of second conductivity type;
(b) a first capacitive device formed on a second semiconductor substrate region of second conductivity type, said capacitive device comprising:
first and second injector regions of third conductivity type, a first channel region of second conductivity type separating said first and second injector regions, and
a first electrically floating structure disposed above said first channel region, wherein a first edge portion of said first structure overlaps a portion of said first injector region and a second edge portion of said first structure overlaps a portion of said second injector region, and
a control gate region of fourth conductivity type located within said second semiconductor substrate region; and
a second capacitive device within said second conductivity type semiconductor substrate comprising: a third and fourth injector region of third conductivity type, a second channel region of second conductivity type separating said third and fourth injector regions, and a second electrically floating structure disposed above said second channel region, wherein a first edge portion of said second floating structure overlaps a portion of said third injector region and a second edge portion of said second floating structure overlaps a portion of said fourth injector region; and
said first injector region of said first capacitive device and said third injector region of said second capacitive device are separated by a region of said second conductivity type semiconductor substrate; and
said second injector region of said first capacitive device and said fourth injector region of said second capacitive device are separated by a region of said second conductivity type semiconductor substrate; and
said first and second floating structures and said gate structure being electrically connected together.

56. The EEPROM memory cell as defined in claim 55, wherein said EEPROM memory cell device is adapted to receive bias voltages for providing programming by band-to-band-tunnelling at said second capacitive device.

57. The EEPROM memory cell as defined in claim 55, wherein said EEPROM memory cell device is adapted to receive bias voltages for providing erasing by Fowler-Nordheim tunnelling at said second capacitive device.

58. The EEPROM memory cell of claim 55, wherein said first conductivity type is p, said second conductivity type is n, said third conductivity type is p+ and said fourth conductivity type is n+.

59. The EEPROM memory cell of claim 55, wherein said first and second injector regions of said first capacitive device are adapted to longitudinally extend by a first length beneath said first electrically floating structure.

60. The EEPROM memory cell of claim 59, wherein said third and fourth injector regions of said second capacitive device are adapted to longitudinally extend by a second length beneath said second electrically floating structure.

61. The EEPROM memory cell of claim 60, wherein said first length is substantially longer than said second length.

62. The EEPROM memory cell of claim 55, wherein said first capacitive device has a first capacitance magnitude and said second capacitive device has a second capacitance magnitude.

63. The EEPROM memory cell of claim 62, wherein said first capacitance magnitude is larger than said second capacitance magnitude.

* * * * *